(12) United States Patent
Hou et al.

(10) Patent No.: US 11,646,282 B2
(45) Date of Patent: May 9, 2023

(54) BONDED SEMICONDUCTOR DIE ASSEMBLY WITH METAL ALLOY BONDING PADS AND METHODS OF FORMING THE SAME

(71) Applicant: SANDISK TECHNOLOGIES LLC, Addison, TX (US)

(72) Inventors: Lin Hou, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/167,161

(22) Filed: Feb. 4, 2021

(65) Prior Publication Data
US 2022/0246562 A1 Aug. 4, 2022

(51) Int. Cl.
*H01L 23/48* (2006.01)
*H01L 23/00* (2006.01)
(Continued)

(52) U.S. Cl.
CPC .............. *H01L 24/08* (2013.01); *H01L 24/05* (2013.01); *H01L 24/80* (2013.01); *H01L 25/0657* (2013.01); *H01L 25/18* (2013.01); *H01L 25/50* (2013.01); *H01L 2224/05082* (2013.01); *H01L 2224/05101* (2013.01); *H01L 2224/05124* (2013.01); *H01L 2224/05147* (2013.01); *H01L 2224/05155* (2013.01); *H01L 2224/05163* (2013.01); *H01L 2224/08145* (2013.01); *H01L 2224/80031* (2013.01);
(Continued)

(58) Field of Classification Search
None
See application file for complete search history.

(56) References Cited

U.S. PATENT DOCUMENTS 6,376,353 B1    4/2002  Zhou et al.
10,283,493 B1   5/2019  Nishida
(Continued)

FOREIGN PATENT DOCUMENTS

WO    WO 2019-143400 A1    7/2019

OTHER PUBLICATIONS

Notification of Transmittal of the International Search Report and the Written Opinion of the International Searching Authority for International Patent Application No. PCT/US2021/034090, dated Oct. 7, 2021, 13 pages.
(Continued)

*Primary Examiner* — Hung K Vu
(74) *Attorney, Agent, or Firm* — The Marbury Law Group PLLC

(57) ABSTRACT

A bonded assembly includes a first semiconductor die and a second semiconductor die. The first semiconductor die includes first metallic bonding pads embedded in first dielectric material layers, the second semiconductor die includes second metallic bonding pads embedded in second dielectric material layers, the first metallic bonding pads are bonded to a respective one of the second metallic bonding pads; and each of the first metallic bonding pads includes a corrosion barrier layer containing an alloy of a primary bonding metal and at least one corrosion-suppressing element that is different from the primary bonding metal.

20 Claims, 21 Drawing Sheets

(51) Int. Cl.
*H01L 25/18* (2023.01)
*H01L 25/00* (2006.01)
*H01L 25/065* (2023.01)
(52) U.S. Cl.
CPC .............. *H01L 2224/80895* (2013.01); *H01L 2224/80896* (2013.01); *H01L 2924/01005* (2013.01); *H01L 2924/01013* (2013.01); *H01L 2924/01015* (2013.01); *H01L 2924/01028* (2013.01); *H01L 2924/01029* (2013.01); *H01L 2924/1431* (2013.01); *H01L 2924/14511* (2013.01)

(56) References Cited

U.S. PATENT DOCUMENTS

| | | |
|---|---|---|
| 10,354,980 B1 | 7/2019 | Mushiga et al. |
| 10,354,987 B1 | 7/2019 | Mushiga et al. |
| 10,510,738 B2 | 12/2019 | Kim et al. |
| 10,714,497 B1 | 7/2020 | Nishida et al. |
| 10,797,062 B1 | 10/2020 | Nishikawa et al. |
| 10,910,272 B1 | 2/2021 | Zhou et al. |
| 2001/0000416 A1 | 4/2001 | Uzoh |
| 2003/0217462 A1 | 11/2003 | Wang et al. |
| 2005/0098605 A1 | 5/2005 | Edelstein et al. |
| 2009/0014848 A1 | 1/2009 | Ong Wai Lian et al. |
| 2012/0091568 A1 | 4/2012 | Ong Wai Lian et al. |
| 2013/0043598 A1 | 2/2013 | Chen et al. |
| 2013/0270328 A1 | 10/2013 | Di Cioccio et al. |
| 2014/0035168 A1* | 2/2014 | Schelling ............... H05K 1/111 174/257 |
| 2015/0247244 A1* | 9/2015 | Beyne ..................... C23C 30/00 428/668 |
| 2019/0221557 A1 | 7/2019 | Kim et al. |
| 2019/0304884 A1 | 10/2019 | Larisegger et al. |
| 2019/0393156 A1 | 12/2019 | Zierath et al. |
| 2020/0091039 A1 | 3/2020 | Shao et al. |
| 2020/0286875 A1* | 9/2020 | Nishida ................... H01L 24/09 |

OTHER PUBLICATIONS

Burleigh, T. D. et al., "Effect of alloying on the resistance of Cu-10% Ni alloys to seawater impingement," Corrosion 55.8 (1999): 800-804.
Cere, S. et al., "Properties of the passive films present on copper and copper-nickel alloys in slightly alkaline solutions," Journal of materials science letters 21.6 (2002): 493-495.
Cho, B-J. et al. "Effect of pH and chemical mechanical planarization process conditions on the copper-benzotriazole complex formation," Japanese Journal of Applied Physics 55.6S3 (2016): 06JB01.
Haesevoets, et al., "Copper Rich Cu1-xNix Alloys (0.05< x< 0.15) Electrodeposited from Acid Sulfate-Based Electrolyte with Benzotriazole Additive for Microbump Metallization for 3D Stacked Integrate Circuits." Journal of the Electrochemical Society 166.8 (2019): D315.
Jin, T., et al. "Surface Characterization and Corrosion Behavior of 90/10 Copper-Nickel Alloy in Marine Environment," Materials 12.11 (2019): 1869.
Lelevic, A. et al., "Electrodeposition of NiP alloy coatings: A review," Surface and Coatings Technology 369 (2019): 198-220.
Lokhande, A. C. et al., "Studies on enhancement of surface mechanical properties of electrodeposited Ni—Co alloy coatings due to saccharin additive," Surface and Coatings Technology 258 (2014): 225-231.
Offoiach, R., et al. "Tribocorrosion study of Ni/B electrodeposits with low B content," Surface and Coatings Technology 369 (2019): 1-15.
Panigrahi, A.K., et al. "Oxidation Resistive, CMOS Compatible Copper-Based Alloy Ultrathin Films as a Superior Passivation Mechanism for Achieving 150 C Cu—Cu Wafer on Wafer Thermocompression Bonding," IEEE Transactions on Electron Devices 64.3 (2017): 1239-1245.
Roberts, B. et al., "Interconnect metallization for future device generations," Solid State Technology. Feb. 95, vol. 38 Issue 2, p. 69 (1995).
Ryu, H-Y., et al. "Selection and Optimization of Corrosion Inhibitors for Improved Cu CMP and Post-Cu CMP Cleaning," ECS Journal of Solid State Science and Technology 8.5 (2019): p. 3058.
Salicio-Paz, A. et al. "Monolayered versus multilayered electroless NiP coatings: impact of the plating approach on the microstructure, mechanical and corrosion properties of the coatings," Surface and Coatings Technology 368 (2019): 138-146.
Salleh, S. et al., "Effects of non-spherical colloidal silica slurry on Al—NiP hard disk substrate CMP application," Applied Surface Science 360 (2016): 59-68.
Varea, A. et al., "Mechanical properties and corrosion behaviour of nanostructured Cu-rich CuNi electrodeposited films," Int. J. Electrochem. Sci 7.2 (2012): 1288-1302.
Wang, Y. L. et al., "Material characteristics and chemical-mechanical polishing of aluminum alloy thin films" Thin Solid Films 332.1-2 (1998): 397-403.
Zhou, J. et al., "Study on the film forming mechanism, corrosion inhibition effect and synergistic action of two different inhibitors on copper surface chemical mechanical polishing for GLSI," Applied Surface Science 505 (2020): 144507.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/523,029, filed Jul. 26, 2019, SanDisk Technologies LLC.
U.S. Appl. No. 16/682,848, filed Nov. 13, 2019, SanDisk Technologies LLC.
U.S. Appl. No. 16/694,400, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/851,839, filed Apr. 17, 2020, SanDisk Technologies LLC.
U.S. Appl. No. 16/851,908, filed Apr. 17, 2020, SanDisk Technologies LLC.
U.S. Appl. No. 16/891,843, filed Jun. 3, 2020, SanDisk Technologies LLC.
U.S. Appl. No. 17/094,543, filed Nov. 10, 2020, SanDisk Technologies LLC.
U.S. Appl. No. 17/106,884, filed Nov. 30, 2020, SanDisk Technologies LLC.
U.S. Appl. No. 17/118,036, filed Dec. 10, 2020, SanDisk Technologies LLC.
Notification of Transmittal of the International Search Report and the Written Opinion of the International Searching Authority for International Patent Application No. PCT/US2021/034090, dated Nov. 1, 2021, 10 pages.

* cited by examiner

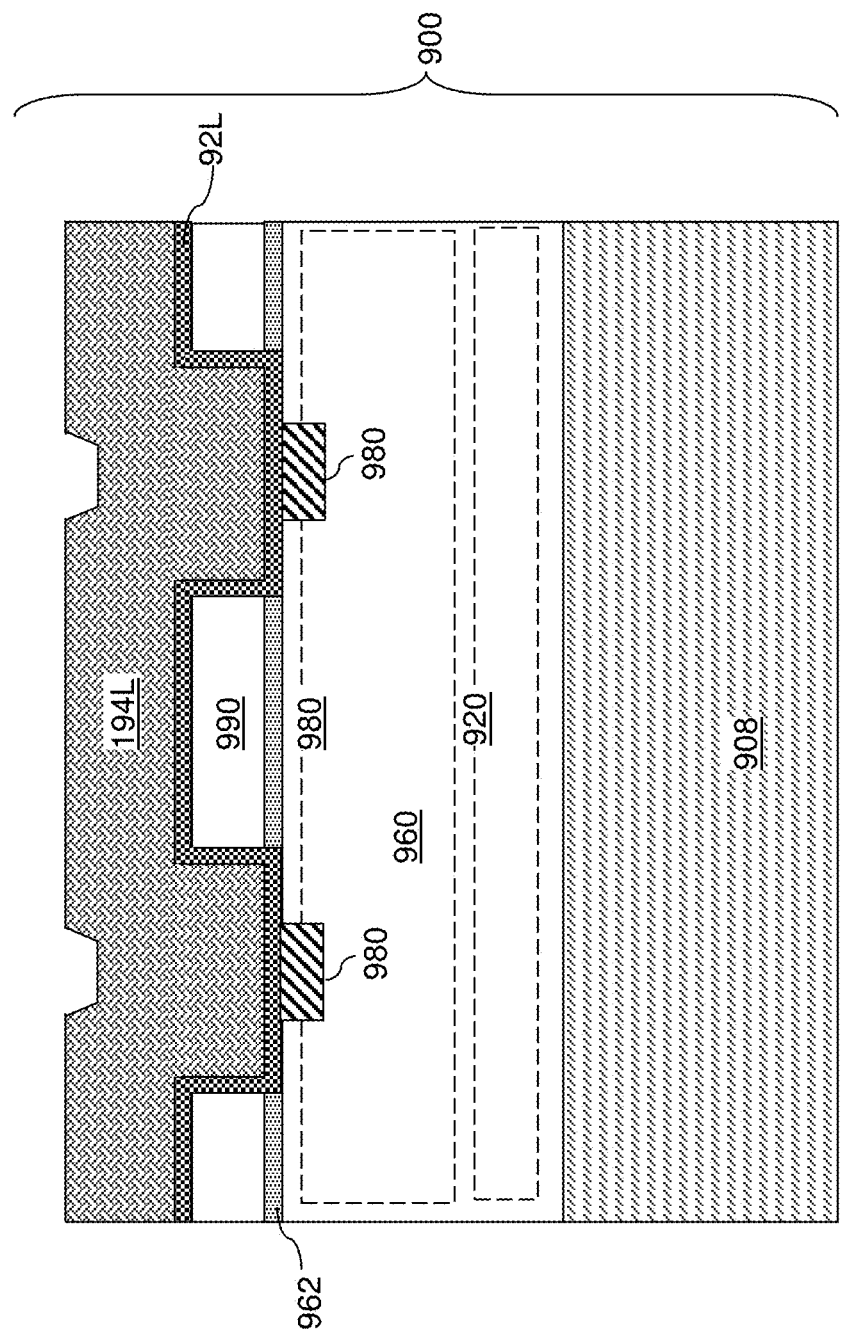

BONDED SEMICONDUCTOR DIE ASSEMBLY WITH METAL ALLOY BONDING PADS AND METHODS OF FORMING THE SAME

FIELD

The present disclosure relates generally to the field of semiconductor devices, and particularly to semiconductor dies having corrosion-resistant, meta; alloy bonding pads and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a method of forming a semiconductor structure includes providing a first semiconductor die, the first semiconductor die including first semiconductor devices located over a first substrate and including first metal interconnect structures embedded in first dielectric material layers, forming pad cavities on a front side of the first semiconductor die, wherein surfaces of a subset of the first metal interconnect structures are physically exposed at bottom surfaces of the pad cavities, and forming first metallic bonding pads in the pad cavities. Each of the first metallic bonding pads comprises a corrosion barrier layer comprising an alloy of a primary bonding metal and at least one corrosion-suppressing element that is different from the primary bonding metal.

According to another aspect of the present disclosure, a bonded assembly includes a first semiconductor die and a second semiconductor die. The first semiconductor die includes first metallic bonding pads embedded in first dielectric material layers, the second semiconductor die includes second metallic bonding pads embedded in second dielectric material layers, the first metallic bonding pads are bonded to a respective one of the second metallic bonding pads; and each of the first metallic bonding pads includes a corrosion barrier layer containing an alloy of a primary bonding metal and at least one corrosion-suppressing element that is different from the primary bonding metal.

BRIEF DESCRIPTION OF THE DRAWINGS

FIGS. 4A and 4B are sequential vertical cross-sectional views of a region of a third configuration of the first semiconductor die during formation of first metallic bonding pads according to a third embodiment of the present disclosure.

DETAILED DESCRIPTION

Figure 1:
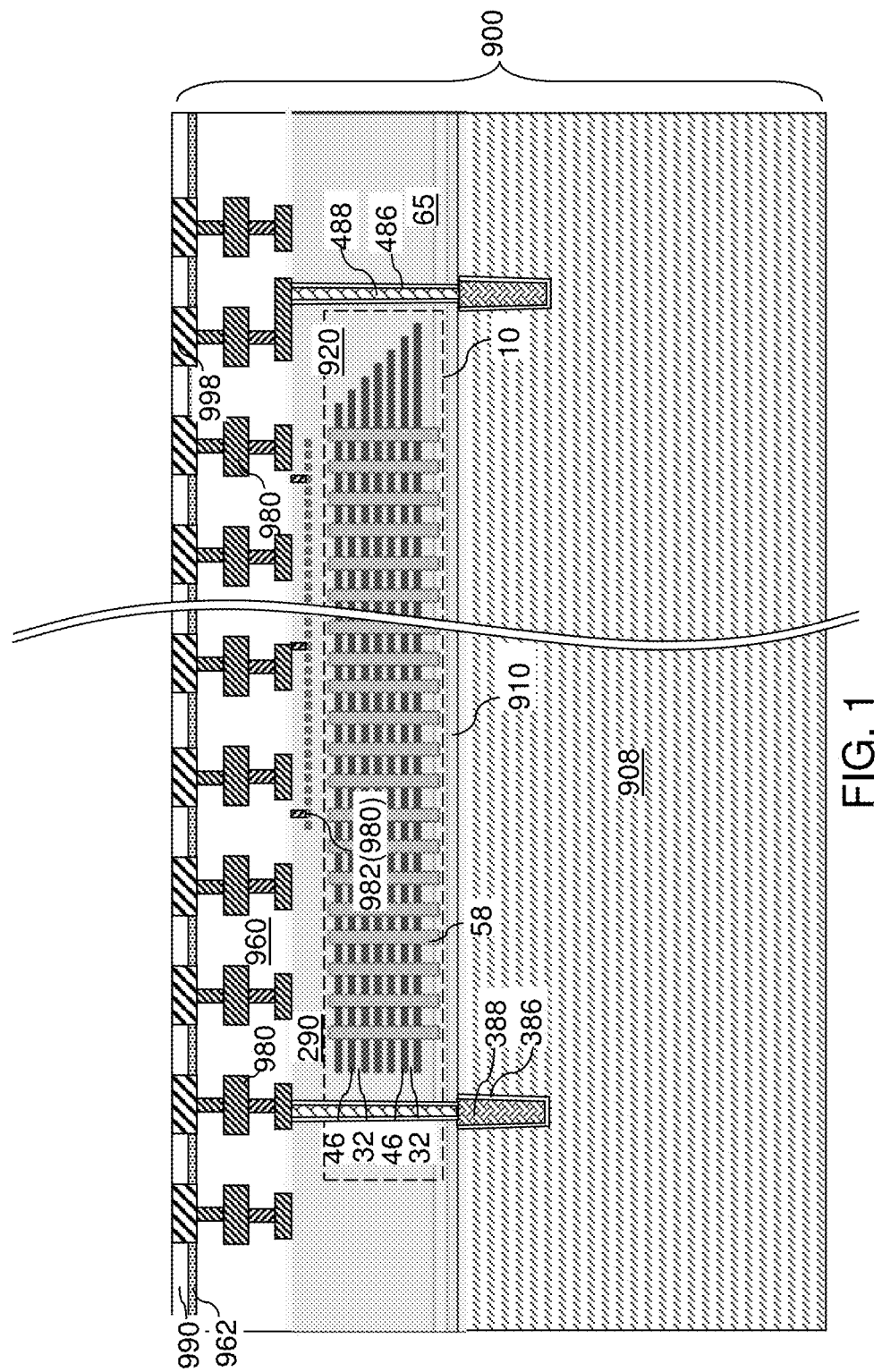
FIG. 1 is a schematic vertical cross-sectional view of a first semiconductor die after formation of a first pad-level dielectric layer and first metallic bonding pads according to an embodiment of the present disclosure.

Wafer-to-wafer bonding or die-to-die bonding can be used to vertically stack semiconductor dies, thereby enabling manufacture of stacked bonded semiconductor dies. Corrosion of metal in the metallic bonding pads has deleterious effects in metal-to-metal bonding. Corroded metallic bonding pad surfaces provide reduced bonding strength, voids and reduced resistance to electromigration. Embodiments of the present disclosure are directed to corrosion-resistant metal alloy (e.g., copper or aluminum alloy) bonding pads for semiconductor die bonding and methods for forming the same, the various aspects of which are described now in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 is illustrated. The first semiconductor die 900 includes a first substrate 908, first semiconductor devices 920 overlying the first substrate 908, first interconnect-level dielectric material layers (290, 960) located on the first semiconductor devices, and first metal interconnect structures 980 embedded in the first interconnect-level dielectric material layers (290, 960). In one embodiment, the first substrate 908 may be a first substrate such as a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. As used herein, a "proximal" surface refers to a surface that is close to a substrate, and a "distal" surface refers to a surface that is distal from the substrate. In the first semiconductor die 900, a proximal surface refers to a surface that is close to the first substrate 908, and a distal surface refers to a surface that is distal from the first substrate 908.

The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include multiple memory-side metal line levels and multiple memory-side metal via levels.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. The first distal interconnect-level dielectric material layers 960 may include one or more dielectric diffusion barrier liners (not expressly shown). In this case, each dielectric diffusion barrier liner embedded in the first distal interconnect-level dielectric material layers 960 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier liner embedded in the first distal interconnect-level dielectric material layers 960 may include a dielectric material having a dielectric constant less than 5, such as SiCN having a dielectric constant of about 3.8, to reduce RC delay of the first metal interconnect structures 980. Each dielectric diffusion barrier liner may have a thickness in a range from 10 nm to 30 nm.

A layer stack including an optional first interconnect-capping dielectric diffusion barrier liner 962 and a first pad-level dielectric layer 990 can be formed. The first interconnect-capping dielectric diffusion barrier liner 962 can include a dielectric material that blocks copper diffusion. In one embodiment, the first interconnect-capping dielectric diffusion barrier liner 962 can include silicon nitride, silicon carbonitride, silicon oxynitride, or a stack thereof. The thickness of the first interconnect-capping dielectric diffusion barrier liner 962 can be in a range from 5 nm to 50 nm, although lesser and greater thicknesses can also be employed.

The first pad-level dielectric layer 990 may include, and/or consist essentially of, undoped silicate glass (e.g., silicon oxide), a doped silicate glass, organosilicate glass, silicon nitride, silicon carbonitride, or a dielectric metal oxide. The thickness of the first pad-level dielectric layer 990 may be in a range from 100 nm to 300 nm, although lesser and greater thicknesses may also be employed. The first pad-level dielectric layer 990 may have a planar top surface.

FIGS. 2A-2E are sequential vertical cross-sectional views of a region of a first configuration of the first semiconductor die 900 during formation of first metallic bonding pads 998 according to a first embodiment of the present disclosure.

Figure 2A:
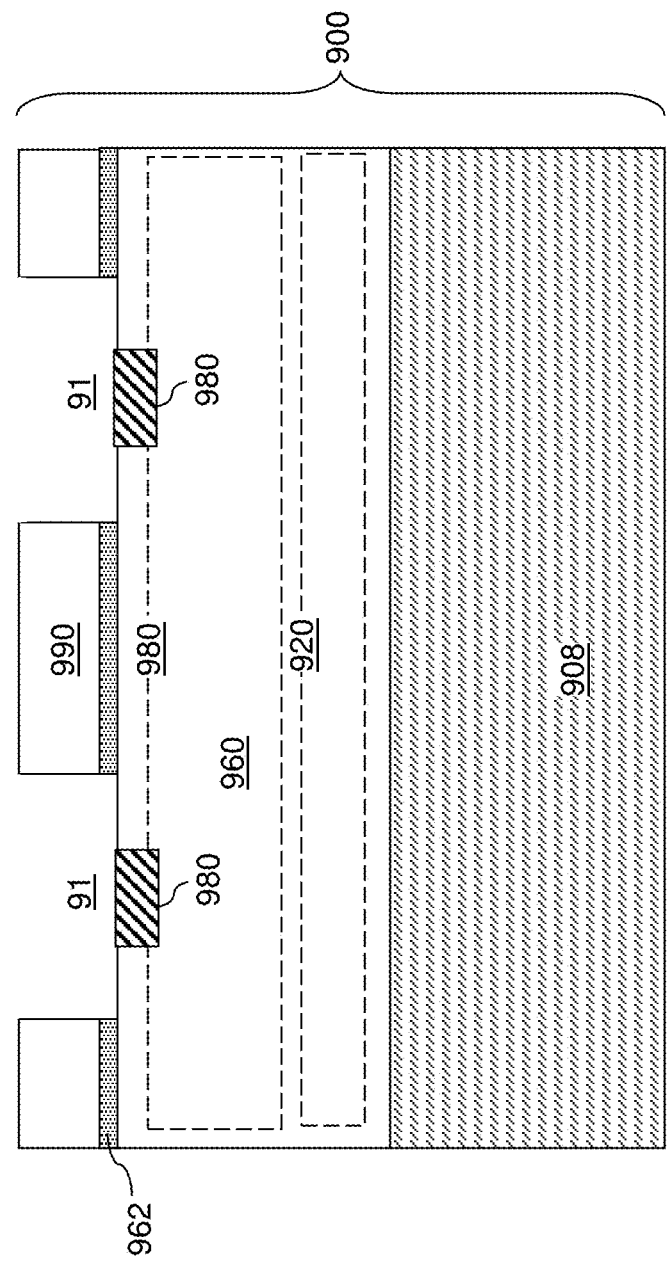
FIGS. 2A-2E are sequential vertical cross-sectional views of a region of a first configuration of the first semiconductor die during formation of first metallic bonding pads according to a first embodiment of the present disclosure.

Referring to FIG. 2A, a photoresist layer can be applied over the first pad-level dielectric layer 990, and can be lithographically patterned to form discrete openings in areas that overlie topmost metal interconnect structures of the first metal interconnect structures 980. An anisotropic etch process can be performed to transfer the pattern of the openings in the photoresist layer through the first pad-level dielectric layer 990 and first interconnect-capping dielectric diffusion barrier liner 962. First pad via cavities 91 are formed through the first pad-level dielectric layer 990 and the first interconnect-capping dielectric diffusion barrier liner 962 in areas that overlie metal interconnect structures 980. A top surface of a topmost metal interconnect structure 980 can be physically exposed at the bottom of each first pad via cavity 91. In one embodiment, each first pad via cavity 91 can be formed within the area of a respective one of the topmost metal interconnect structures.

The region of the first configuration of the first semiconductor die 900 is illustrated in FIG. 2A after formation of the first pad cavities 91. The first pad cavities 91 may have a horizontal cross-sectional shape of a rectangle or a rounded rectangle. Each of the first pad cavities 91 can have two pairs of parallel sidewalls that define four sidewalls of the first pad cavity 91. The lateral distances (i.e., length and width) of the first pad cavities 91, as measured between a respective pair of parallel sidewalls, may be 200 nm or less, such as in a range from 50 nm to 200 nm, such as from 100 nm to 150 nm, although lesser and greater lateral distances can also be employed. The pitch of the first pad cavities 91 may be 1 micron or less, such as in a range from 200 nm to 1 microns.

Generally, a first semiconductor die 900 including first semiconductor devices 920 located on a first substrate 908 and including first metal interconnect structures 980 embedded in first dielectric material layers (960, 962, 990) can be provided. First pad cavities 91 can be formed on a front side of the first semiconductor die 900 such that surfaces of a subset of the first metal interconnect structures 980 are physically exposed at bottom surfaces of the first pad cavities 91.

Referring to the subsequent figures, an optional pad-level metallic barrier liner and at least one pad-level metallic fill material can be sequentially deposited in the first pad via cavities. Excess portions of the pad-level metallic barrier liner and at least one pad-level metallic fill material can be removed from above the horizontal plane including the top surface of the first pad-level dielectric layer 990. Remaining portions of the pad-level metallic barrier liner and at least one pad-level metallic fill material comprise first metallic bonding pads 998. Various embodiments of the present disclosure provide methods and structures for forming the first metallic bonding pads 998 as corrosion-resistant structures. Additional embodiments of the present disclosure provide methods and structures for forming a second semiconductor die containing second metallic bonding pads as corrosion-resistant structures. Further embodiments of the present disclosure provide methods and structures for forming a bonded assembly of semiconductor dies containing corrosion-resistant metallic bonding pads.

Figure 2B:
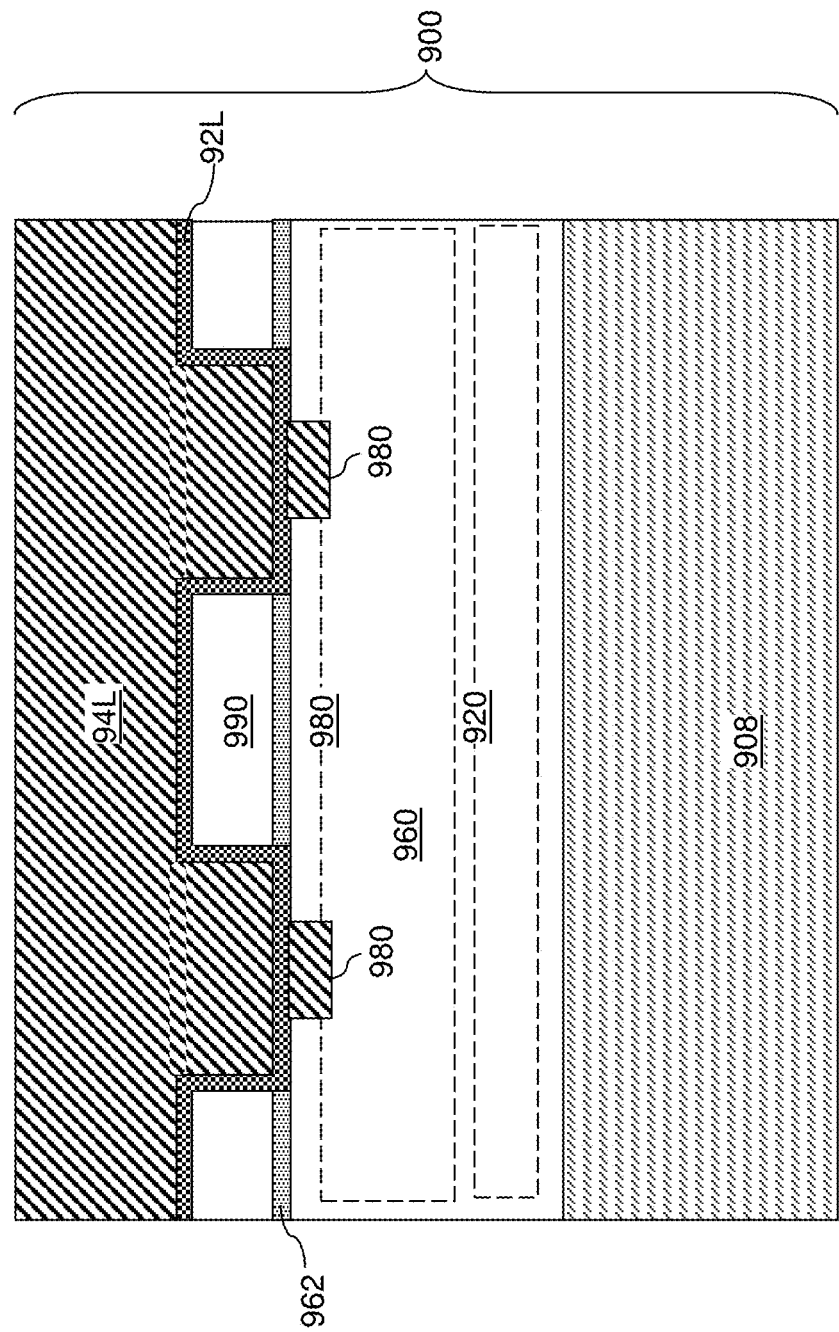

Specifically, referring to FIG. 2B, an optional continuous metallic barrier liner 92L including a conductive metallic nitride material can be deposited directly on physically exposed surfaces of the pad cavities 91. The continuous metallic barrier liner 92L includes a conductive metallic barrier material such as TiN, TaN, and/or WN. The conductive metallic barrier material can block diffusion of copper or aluminum. The thickness of the continuous metallic barrier liner 92L may be in a range from 2 nm to 10 nm, such as from 4 nm to 8 nm, although lesser and greater thicknesses can also be employed. The continuous metallic barrier liner 92L may be deposited by physical vapor deposition or chemical vapor deposition. Alternatively, the continuous metallic barrier liner 92L may be omitted.

A first primary bonding metal layer 94L including a primary bonding metal at a first atomic percentage (i.e., concentration) can be deposited as a continuous material layer within the pad cavities 91 directly on physically exposed surfaces of the continuous metallic barrier liner 92L (if present) or on physically exposed surfaces of the first metal interconnect structures 980 (if liner 92L is omitted). In one embodiment, the primary bonding metal can be a metallic element selected from Cu and Al. The first primary bonding metal layer 94L may be formed by electroplating and/or physical vapor deposition.

In one embodiment, the primary bonding metal is Cu, and the first atomic percentage can be in a range from 90% to 100%, such as from 95% to 99.9999% and/or from 99% to 99.999% and/or from 99.9% to 99.99%. In case the first atomic percentage is not 100%, at least one additive element other than copper can be present within the first primary bonding metal layer 94L. The at least one additive element may include, for example, lead, zinc, nickel, iron, sulfur, antimony, arsenic, silver, tin, calcium, tin, etc. In one embodiment, the total atomic percentage of the at least one additive element may be less than 1%, such as less than 0.1% and/or less than 0.01% and/or less than 0.001%. In one embodiment, the first primary bonding metal layer 94L may be free of nickel, boron, or phosphorus, or may include nickel, boron, and/or phosphorus at an atomic percentage less than 0.1% and/or less than 0.01% and/or less than 0.001% and/or less than 0.0001%.

In another embodiment, the primary bonding metal is Al, and the first atomic percentage can be in a range from 98% to 100%, such as from 99% to 99.9999% and/or from 99.8% to 99.999% and/or from 99.98% to 99.99%. In case the first atomic percentage is not 100%, at least one additive element other than copper can be present within the first primary bonding metal layer 94L. The at least one additive element may include, for example, lead, zinc, nickel, iron, sulfur, antimony, arsenic, silver, tin, calcium, tin, etc. In one embodiment, the total atomic percentage of the at least one additive element may be less than 1%, such as less than 0.1% and/or less than 0.01% and/or less than 0.001%. In one embodiment, the first primary bonding metal layer 94L may be free of copper, or may include copper at an atomic percentage less than 0.1% and/or less than 0.01% and/or less than 0.001% and/or less than 0.0001%.

Figure 2C:
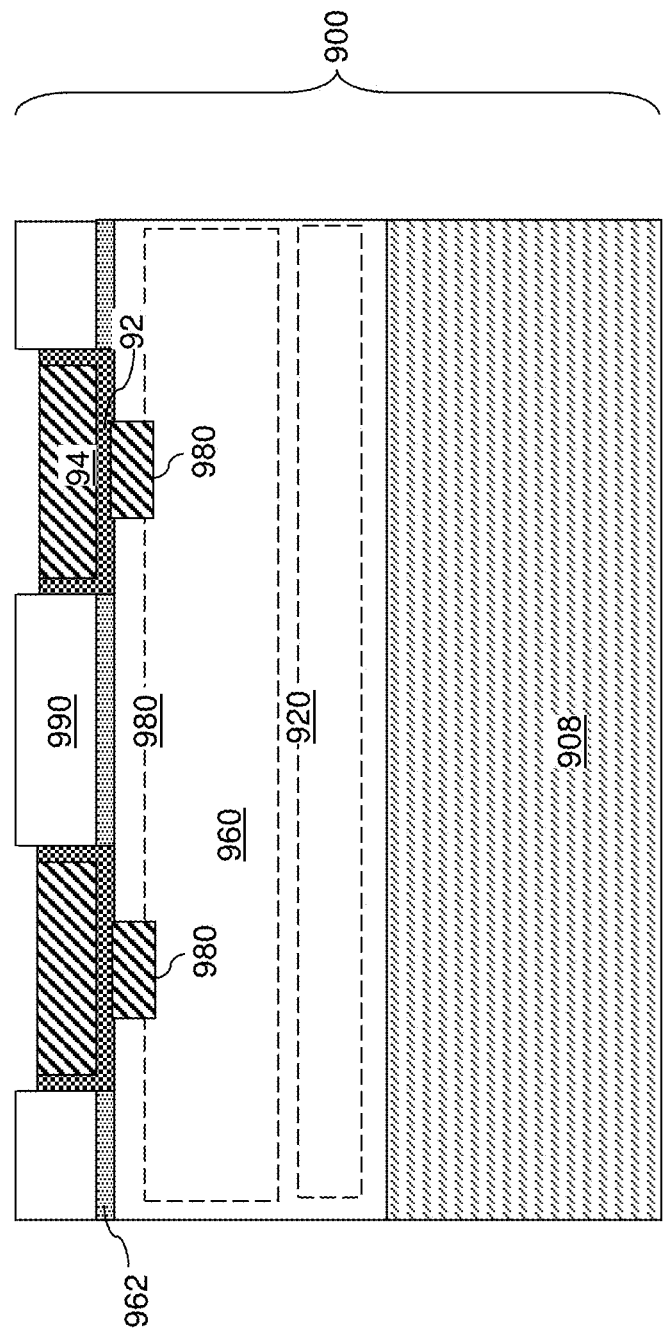

Referring to FIG. 2C, portions of the first primary bonding metal layer 94L and the continuous metallic barrier liner 92L can be removed from above a horizontal plane including a topmost surface of the first dielectric material layers (960, 962, 990), such as the topmost surface of the first pad-level dielectric layer 990, by performing a planarization process. The planarization process can employ a chemical mechanical polishing (CMP) process or a recess etch process (which may comprise an isotropic etch process or an anisotropic etch process).

After removal of the portions of the first primary bonding metal layer 94L and the continuous metallic barrier liner 92L overlying the horizontal plane including the top surface of the first dielectric material layers (960, 962, 990), remaining portions of the first primary bonding metal layer 94L and the continuous metallic barrier liner 92L located within the pad cavities 91 can be vertically recessed below the horizontal plane including the top surface of the first dielectric material layers (960, 962, 990) by a vertical recess distance by performing a recess etch process. The recess etch process can include an isotropic etch process (such as a wet etch process or a chemical dry etch process) and/or an anisotropic etch process (such as a reactive ion etch process). The vertical recess distance may be in a range from 10 nm to 100 nm, such as from 30 nm to 50 nm, although lesser and greater vertical recess distances may also be employed. The vertically recessed remaining portions of the optional continuous metallic barrier liner 92L that remain in the pad cavities 91 comprise optional first metallic barrier liners 92. The vertically recessed remaining portions of the primary bonding material layer 94L that remain in the pad cavities 91 comprise first pad base portions 94, which are proximal regions of first metallic bonding pads (to be subsequently completed) that are proximal to the bottom surfaces of the first pad cavities 91 relative to additional regions of the first metallic bonding pads to be subsequently formed.

Figure 2D:
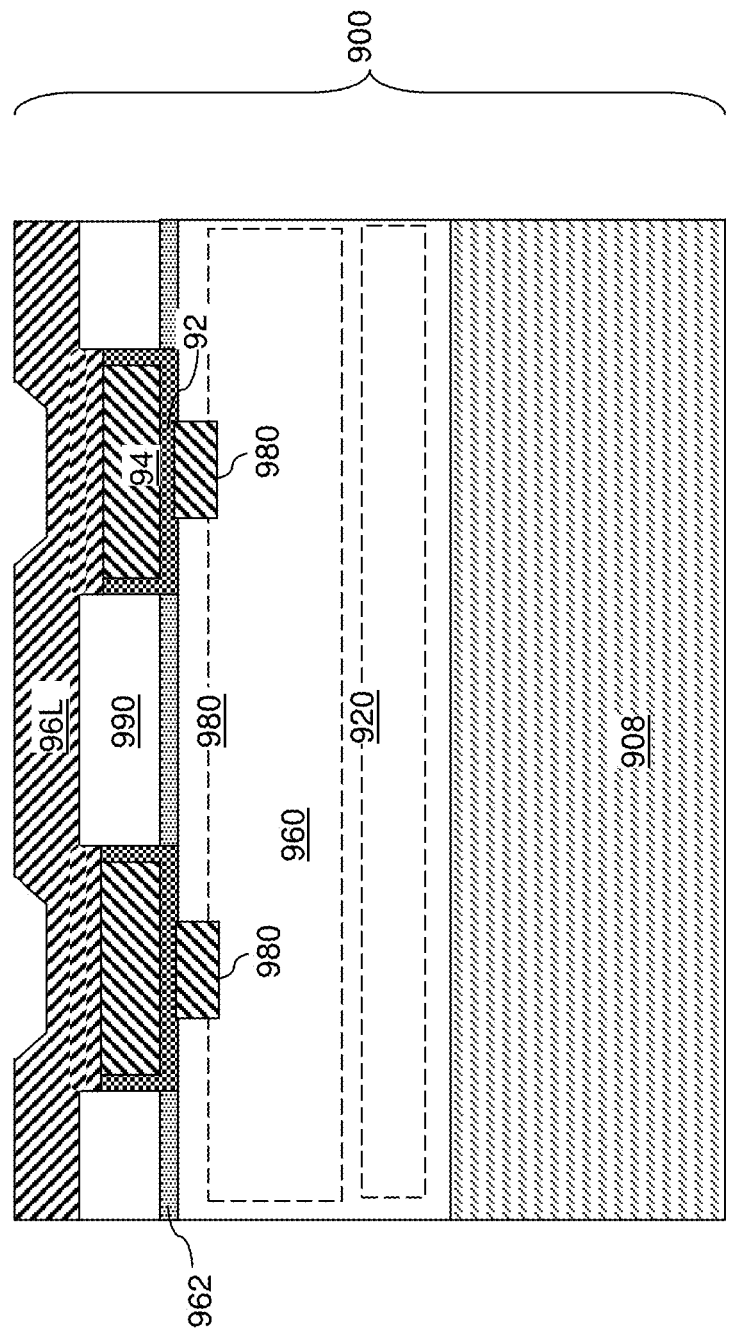

Referring to FIG. 2D, a corrosion barrier layer 96L including the primary bonding metal at the second atomic percentage and including the at least one corrosion-suppressing element can be deposited over the first pad base portions 94. According to an aspect of the present disclosure, the second atomic percentage can be less than the first atomic percentage.

In one embodiment, the primary bonding metal is Cu, and the second atomic percentage can be in a range from 50% to 95%, such as from 55% to 90% and/or from 60% to 85%, and/or from 65% to 80%. In one embodiment, each of the at least one corrosion-suppressing element comprises Ni, B, or P. In one embodiment, the corrosion barrier layer 96L may consist essentially of Cu and a single corrosion-suppressing element selected from Ni, B, or P. The total atomic percentage of the at least one corrosion-suppressing element may be in a range from 10% to 50%, such as from 12.5% to 45%, and/or from 15% to 40%, and/or from 20% to 35%. For example, the corrosion barrier layer 96L may comprise a copper-nickel alloy containing between 5 to 45 atomic percent nickel and balance copper, such as 5 to 15 atomic percent nickel, or 10 atomic percent nickel, or 30 atomic percent nickel or 44 atomic percent nickel, and balance copper. Alternatively, the corrosion barrier layer 96L may comprise a copper-phosphorus or a copper-boron alloy containing between 5 to 20 atomic percent boron or phosphorus and balance copper.

In another embodiment, the primary bonding metal is Al, and the second atomic percentage can be in a range from 90% to 99.5%, such as from 91% to 99.2% and/or from 95% to 99%, and/or from 98% to 99%. The at least one corrosion-suppressing element may include, for example, Cu. In one embodiment, the corrosion barrier layer 96L may comprise an aluminum copper alloy, and in one embodiment may consist essentially of Al and Cu. The total atomic percentage of Cu may be in a range from 0.5% to 10%, such as from 0.8% to 9%, and/or from 1% to 5%, and/or from 1% to 2%.

Generally, the primary bonding metal may be selected from Cu and Al, and the corrosion barrier layer 96L may comprise at least one corrosion-suppressing element that is different from the primary bonding metal and is selected from Ni, B, P, and Cu. If the primary bonding metal is Cu, the at least one corrosion-suppressing element may comprise Ni. In one embodiment, the at least one corrosion-suppressing element may comprise Ni, Ni and B, or Ni and P. In one embodiment, the second atomic percentage is less than the first atomic percentage, and the first pad base portions 94 are free of the at least one corrosion-suppressing element.

Figure 2E:
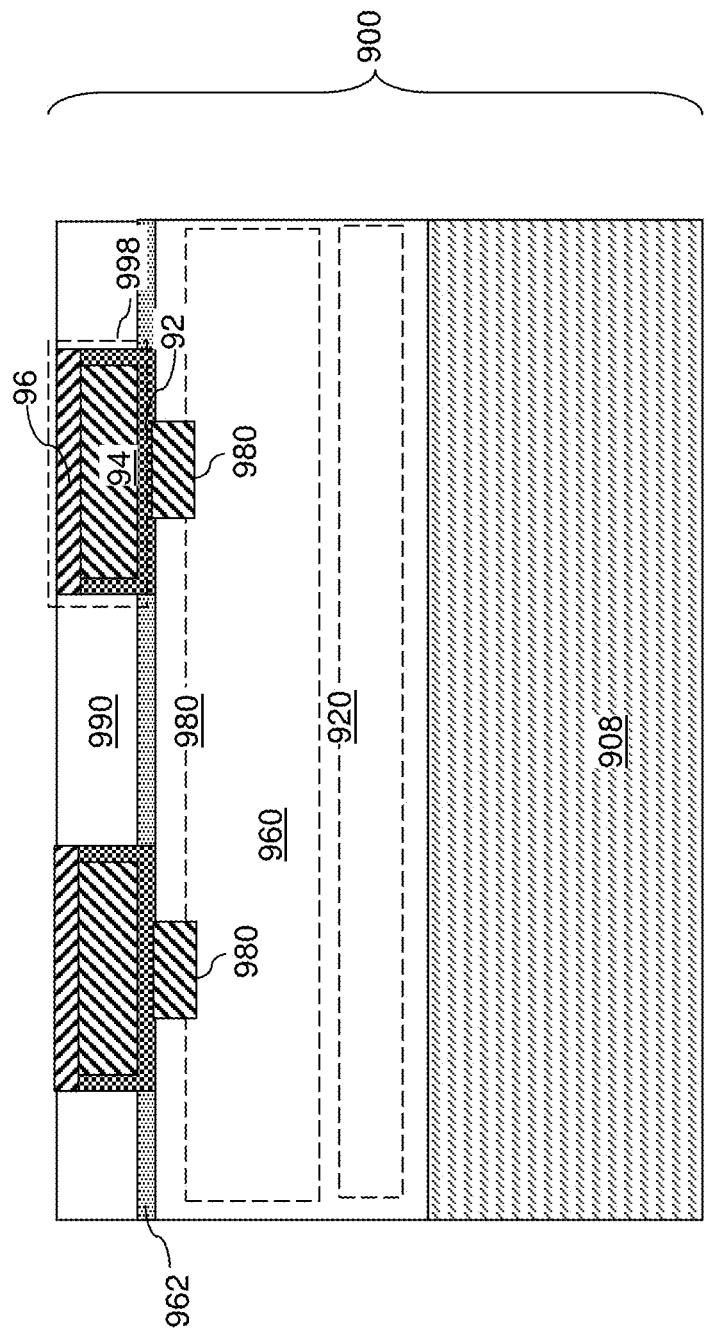

Referring to FIG. 2E, a chemical mechanical polishing process can be performed to remove portions of the corrosion barrier layer 96L that overlie a horizontal plane including a topmost surface of the first dielectric material layers (960, 962, 990) such as the top surface of the first pad-level dielectric layer 990. Remaining portions of the corrosion barrier layer 96L comprise first corrosion barrier layers 96. Each contiguous combination of an optional first metallic barrier liner 92, a first pad base portion 94, and a first corrosion barrier layer 96 constitutes a first metallic bonding pad 998. The thickness of the first corrosion barrier layer 96 may be 100 nm or less, such as 30 nm to 50 nm. Each first metallic bonding pad 998 includes a first pad base portion 94 as a proximal region of the first metallic bonding pad 998 that is formed directly on a first metallic barrier liner 92 (which is a remaining portion of the continuous metallic barrier liner 92L, if present) and is proximal to the bottom surface of a respective pad cavity 91, and a corrosion barrier layer 96 as a distal region that is distal from the bottom surface of the pad cavity 91. Each first metallic bonding pad 998 comprises a respective planar top surface, which consists of a top surface of a first corrosion barrier layer 96. The periphery of the top surface of each first metallic bonding pad 998 can contact a periphery of a periphery of the topmost layer among the first dielectric material layers (960, 962, 990).

Figure 3A:
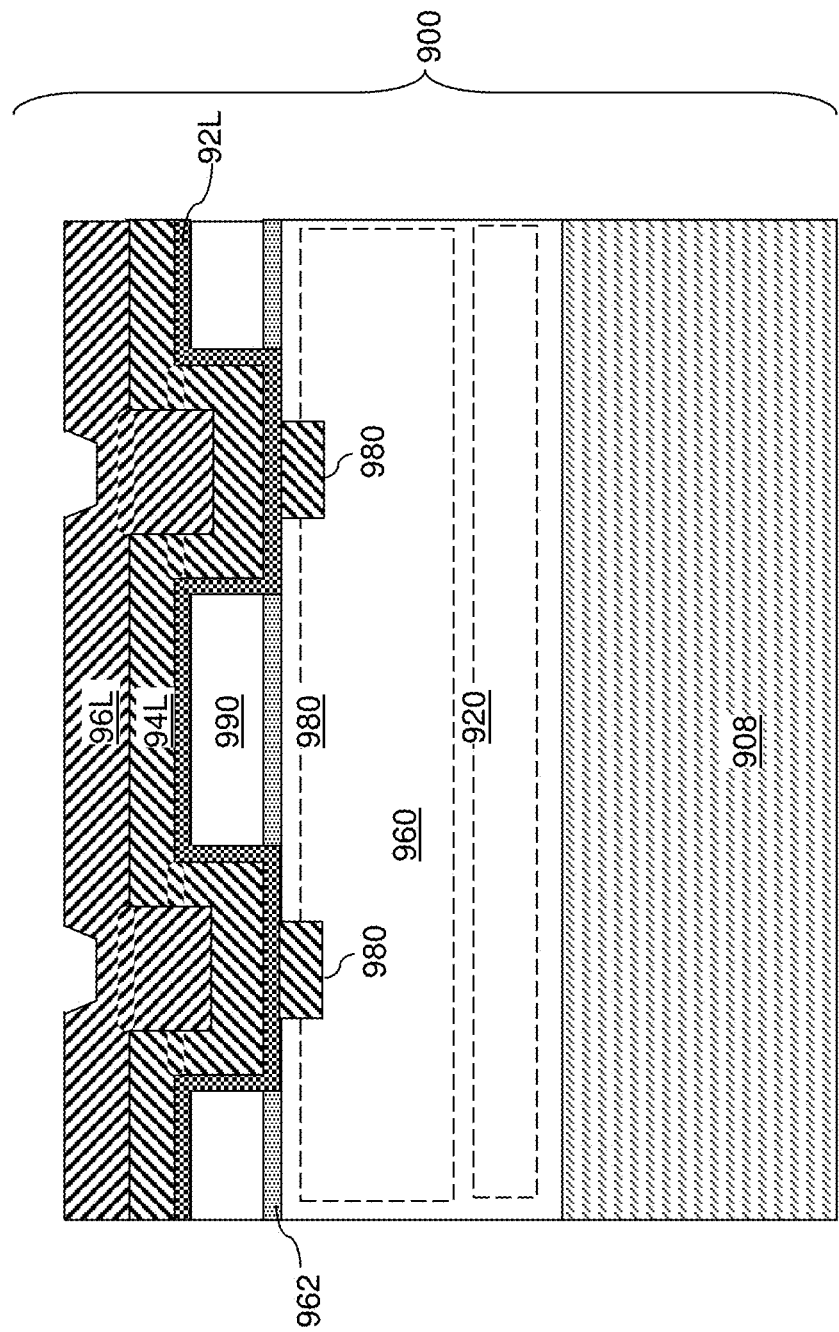
FIGS. 3A and 3B are sequential vertical cross-sectional views of a region of a second configuration of the first semiconductor die during formation of first metallic bonding pads according to a second embodiment of the present disclosure.
Figure 3B:
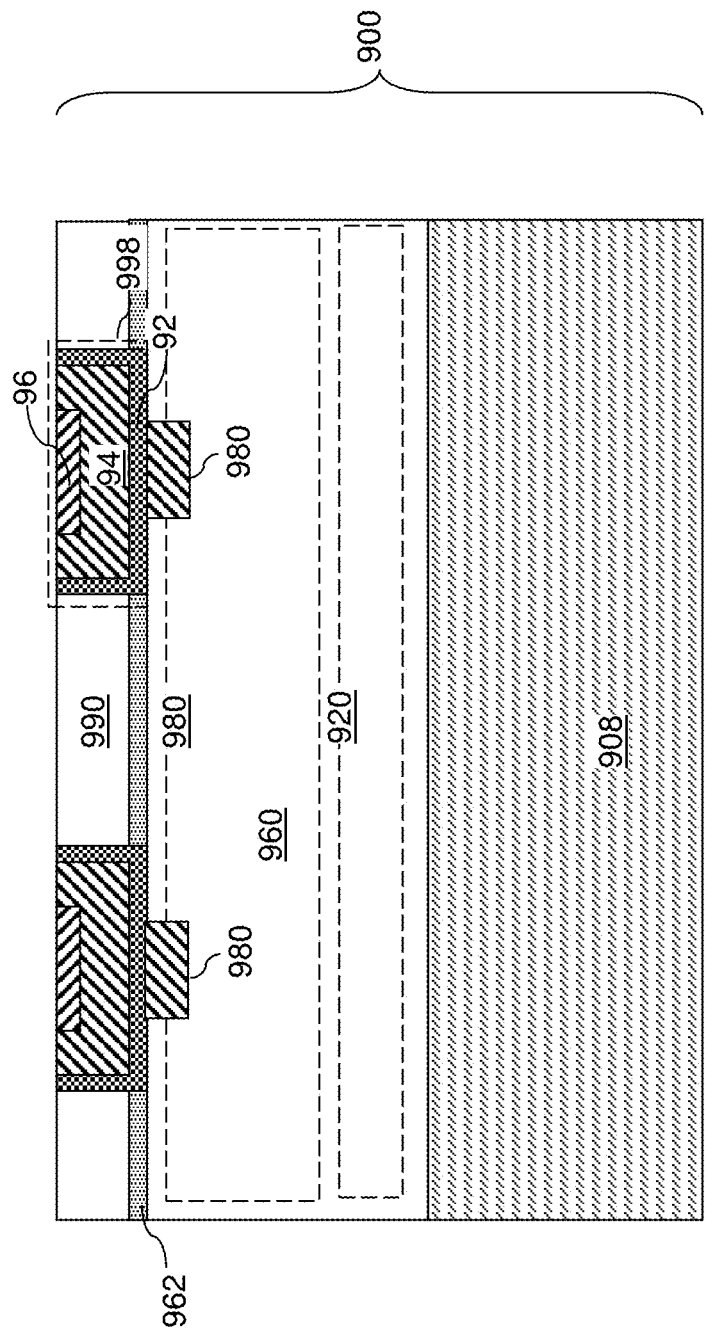

FIGS. 3A and 3B are sequential vertical cross-sectional views of a region of a second configuration of the first semiconductor die 900 during formation of first metallic bonding pads according to a second embodiment of the present disclosure.

Referring to FIG. 3A, the second configuration of the first semiconductor die 900 can be derived from the first configuration of the first semiconductor die 900 illustrated in FIG. 2A by performing the processing steps of FIG. 2B with a reduction in the thickness of the first primary bonding metal layer 94L. Specifically, the thickness of the first primary bonding metal layer 94L can be reduced such that horizontal top surfaces of the first primary bonding metal layer 94L within center portions of the areas of the first pad cavities 91 are formed at a height that is lower than the horizontal plane including the topmost surface of the first dielectric material layers (960, 962, 990) (such as the top surface of the first pad-level dielectric layer 990) by a vertical offset distance. The vertical offset distance may be in a range from 10 nm to 100 nm, such as from 30 nm to 50 nm, although lesser and greater vertical offset distances may also be employed. Generally, each recessed top surface of the first primary bonding metal layer 94L overlying a center portion of each of the pad cavities 91 can be vertically recessed relative to the horizontal plane including the topmost surface of the first dielectric material layers (960, 962, 990) by a vertical distance in a range from 10 nm to 100 nm.

Subsequently, the processing steps of FIG. 2D can be performed to deposit a corrosion barrier layer 96L directly on the top surface of the primary bonding metal layer 94L. The thickness of the corrosion barrier layer 96L can be selected such that the entirety of the top surface of the corrosion barrier layer 96L is located above the horizontal plane including the topmost surface of the first dielectric material layers (960, 962, 990).

Referring to FIG. 3B, the processing steps of FIG. 2E can be performed to remove portions of the corrosion barrier layer 96L, the first primary bonding metal layer 94L and the optional continuous metallic barrier liner 92L that overlie a horizontal plane including a topmost surface of the first dielectric material layers (960, 962, 990) such as the top surface of the first pad-level dielectric layer 990. Remaining portions of the corrosion barrier layer 96L comprise first corrosion barrier layers 96. Each contiguous combination of the first metallic barrier liner 92, the first pad base portion 94, and the optional first corrosion barrier layer 92 constitutes a first metallic bonding pad 998. Thus, in this embodiment, the first metallic bonding pad 998 can be formed during a single planarization step, such as a single CMP step. Each first metallic bonding pad 998 includes a first pad base portion 94 as a proximal region of the first metallic bonding pad 998 that is formed directly on the optional first metallic barrier liner 92 (which is a remaining portion of the continuous metallic barrier liner 92L) and is proximal to the bottom surface of a respective pad cavity 91, and a corrosion barrier layer 96 as a distal region that is distal from the bottom surface of the pad cavity 91. Each first metallic bonding pad 998 comprises a respective planar top surface, which includes a top surface of a first metallic barrier liner 92, a top surface of a first pad base portion 94, and a top surface of a first corrosion barrier layer 96. The periphery of the top surface of each first metallic bonding pad 998 can contact a periphery of a periphery of the topmost layer among the first dielectric material layers (960, 962, 990).

Figure 4B:
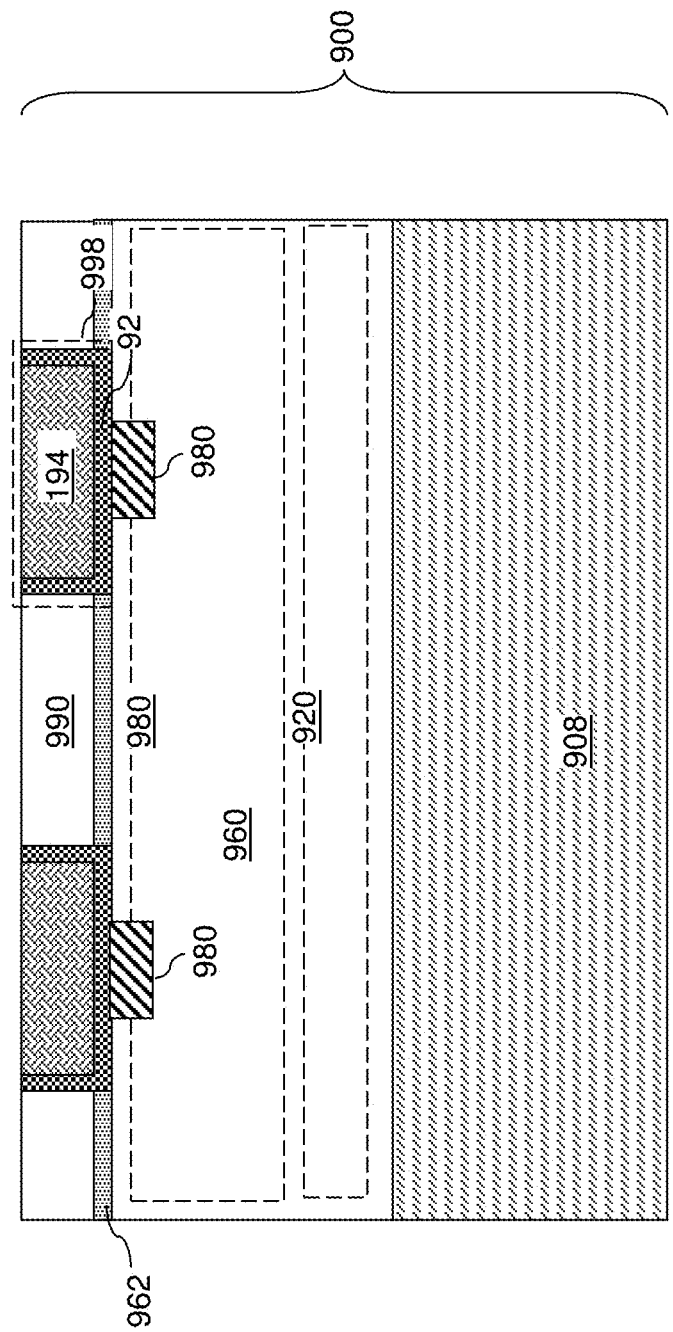

FIGS. 4A and 4B are sequential vertical cross-sectional views of a region of a third configuration of the first semiconductor die 900 during formation of first metallic bonding pads according to a third embodiment of the present disclosure. In the third embodiment, the first pad base portion 94 is omitted.

Referring to FIG. 4A, the third configuration of the first semiconductor die 900 can be derived from the first configuration of the first semiconductor die 900 by depositing the optional continuous metallic barrier liner 92L including a conductive metallic nitride material in the same manner as in the processing steps of FIG. 2B. Alternatively, the continuous metallic barrier liner 92L may be omitted.

Subsequently, the above described corrosion barrier layer 96L including the primary bonding metal at the second atomic percentage and including the at least one corrosion-suppressing element can be deposited on physically exposed surfaces of the continuous metallic barrier liner 92L (if present) or on or on physically exposed surfaces of the first metal interconnect structures 980 (if liner 92L is omitted).

In one embodiment, the percentage (i.e., concentration) of the at least one corrosion-suppressing element may be constant as a function of thickness of the corrosion barrier layer 96L. In another embodiment, the corrosion barrier layer 96L comprises a compositionally modulated corrosion barrier layer in which the percentage (i.e., concentration) of the at least one corrosion-suppressing element may vary (i.e., increase and/or decrease) as a function of thickness of the corrosion barrier layer 96L. The variation of the percentage of the at least one corrosion-suppressing element may be effected by using plating to deposit the corrosion barrier layer 96L and by varying the concentration of the at least one corrosion-suppressing element in the plating bath and/or in the deposited layer during the deposition process. The percentage of the at least one corrosion-suppressing element in the deposited layer may be varied by adjusting the pH value of the plating bath, by adjusting a current density applied during an electroplating process and/or by adjusting a concentration of the deposition control rate additive (e.g., benzotriazole) in the plating bath, as described in Karel P S Haesevoets, Aleksandar Radisic, and Philippe M. Vereecken. "Copper Rich Cu1-xNix Alloys (0.05<x<0.15) Electrodeposited from Acid Sulfate-Based Electrolyte with Benzotriazole Additive for Microbump Metallization for 3D Stacked Integrate Circuits." Journal of The Electrochemical Society, 166 (8) (2019) D315, incorporated herein by reference in its entirety.

Referring to FIG. 4B, a chemical mechanical polishing process can be performed to remove portions of the continuous metallic barrier liner 92L (if present) and the corrosion barrier layer 96L that overlie a horizontal plane including a topmost surface of the first dielectric material layers (960, 962, 990), such as the top surface of the first pad-level dielectric layer 990. Remaining portions of the continuous metallic barrier liner 92L comprise metallic barrier liners 92. Remaining portions of the corrosion barrier layer 96L comprise first corrosion barrier layers 96 bonding metal portions 194. Each contiguous combination of a first metallic barrier liner 92 and a first corrosion barrier layer 96 constitutes a first metallic bonding pad 998. Accordingly, each first corrosion barrier layer 96 may be compositionally homogeneous or may be compositionally modulated.

Figure 5:
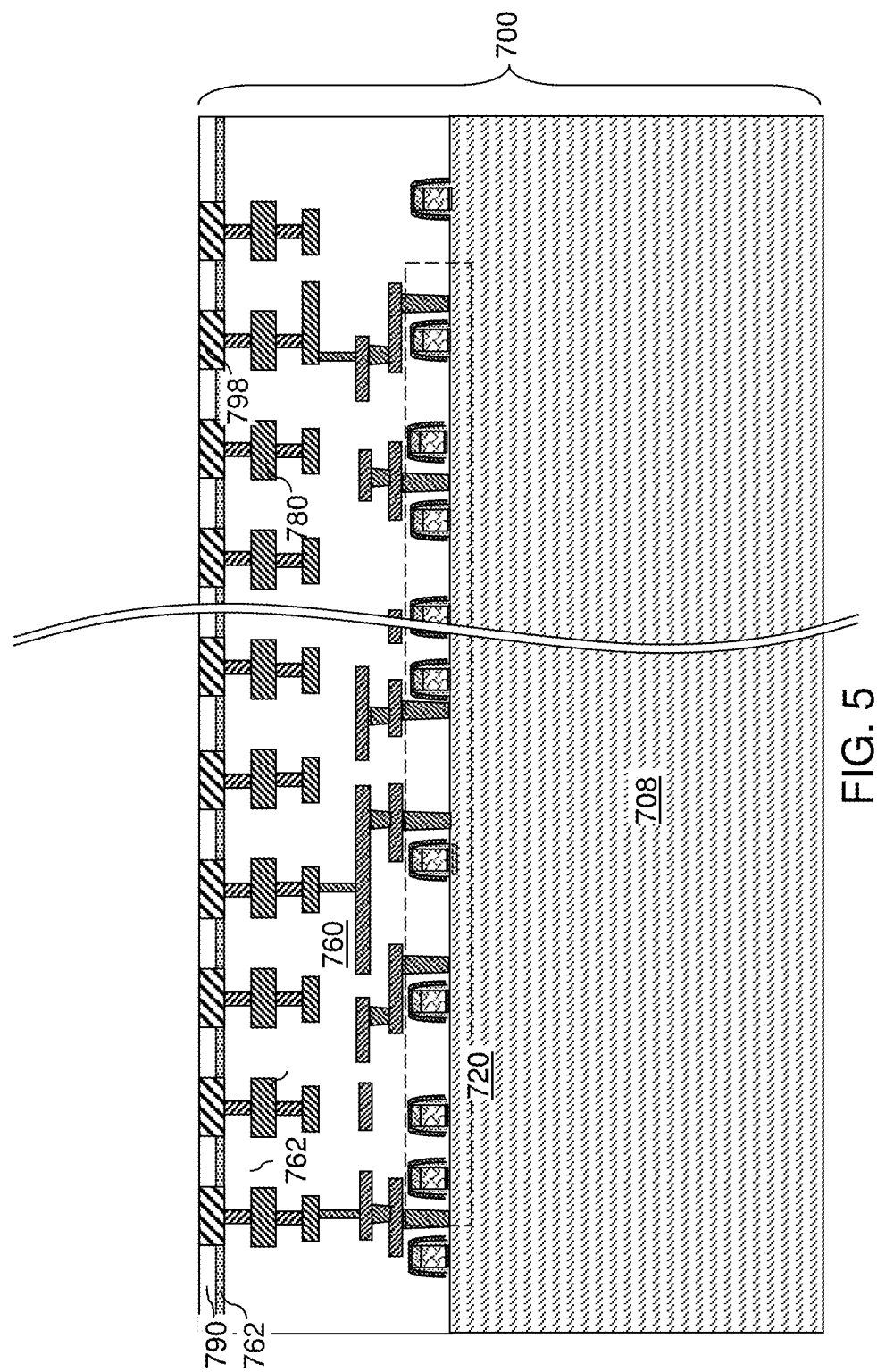
FIG. 5 is a schematic vertical cross-sectional view of a second semiconductor die after formation of a second pad-level dielectric layer and second metallic bonding pads according to an embodiment of the present disclosure.

Referring to FIG. 5, a second semiconductor die 700 according to an embodiment of the present disclosure is illustrated. The second semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) peripheral circuitry for operation of memory devices. In one embodiment, the second substrate 708 may be a second substrate such as a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second interconnect-level dielectric material layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include multiple logic-side metal line levels and multiple logic-side metal line levels.

A layer stack including an optional second interconnect-capping dielectric diffusion barrier liner 762 and a second pad-level dielectric layer 790 can be formed. The second interconnect-capping dielectric diffusion barrier liner 762 can include a dielectric material that blocks copper diffusion. In one embodiment, the second interconnect-capping dielectric diffusion barrier liner 762 can include silicon nitride, silicon carbon nitride, silicon oxynitride, or a stack thereof. The thickness of the second interconnect-capping dielectric diffusion barrier liner 762 can be in a range from 5 nm to 50 nm, although lesser and greater thicknesses can also be employed.

The second pad-level dielectric layer 790 may include, and/or consist essentially of, undoped silicate glass (e.g., silicon oxide), a doped silicate glass, organosilicate glass, silicon nitride, or a dielectric metal oxide. The thickness of the second pad-level dielectric layer 790 may be in a range from 300 nm to 6,000 nm, although lesser and greater thicknesses may also be employed. The second pad-level dielectric layer 790 may have a planar top surface.

A photoresist layer can be applied over the second pad-level dielectric layer 790, and can be lithographically patterned to form discrete openings in areas that overlie topmost metal interconnect structures of the second metal interconnect structures 780. An anisotropic etch process can be performed to transfer the pattern of the openings in the photoresist layer through the second pad-level dielectric layer 790 and second interconnect-capping dielectric diffusion barrier liner 762. Second pad via cavities are formed through the second pad-level dielectric layer 790 and the second interconnect-capping dielectric diffusion barrier liner 762 in areas that overlie metal interconnect structures 780. A top surface of a topmost metal interconnect structure 780 can be physically exposed at the bottom of each second pad via cavity. In one embodiment, each second pad via cavity can be formed within the area of a respective one of the topmost metal interconnect structures.

A pad-level metallic barrier liner and at least one pad-level metallic fill material can be sequentially deposited in the second pad via cavities. Excess portions of the pad-level metallic barrier liner and at least one pad-level metallic fill material can be removed from above the horizontal plane including the top surface of the second pad-level dielectric layer 790. Remaining portions of the pad-level metallic barrier liner and at least one pad-level metallic fill material comprise second metallic bonding pads 798.

The various embodiments illustrated in FIGS. 2A-4B can be employed with appropriate revisions to form the second metallic bonding pads 798 in the second semiconductor die 700.

Figure 6:
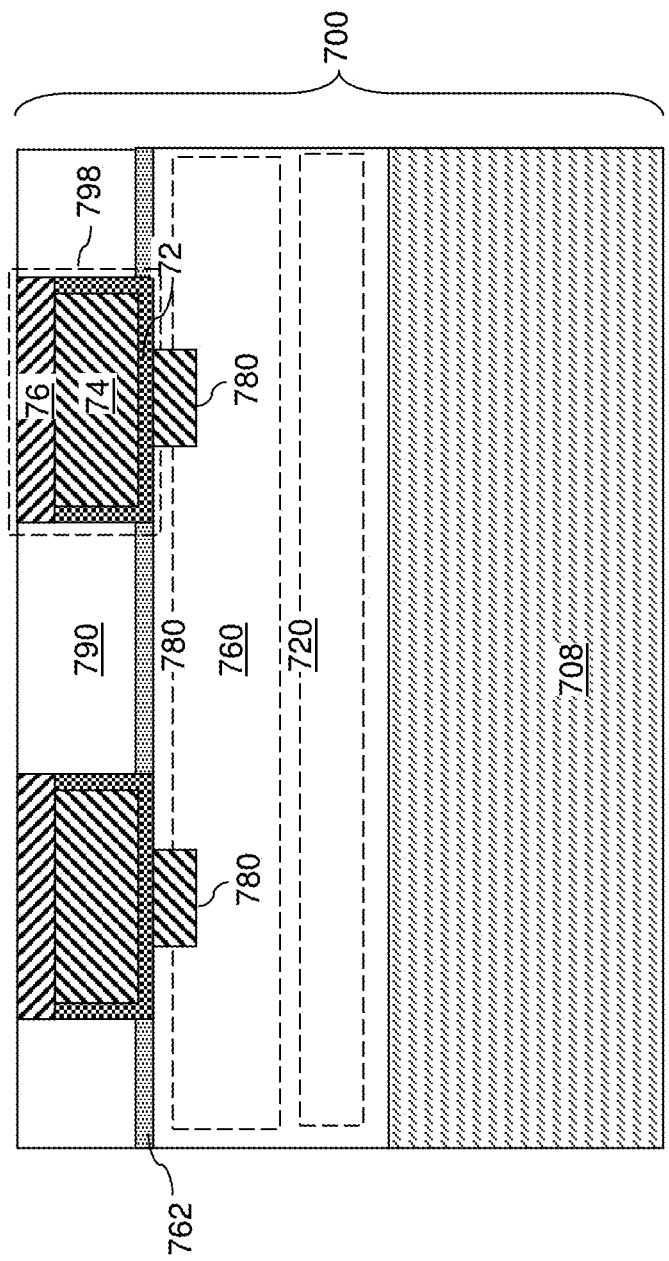
FIG. 6 is a vertical cross-sectional views of a region of a first configuration of the second semiconductor die after formation of second metallic bonding pads according to an embodiment of the present disclosure.

Referring to FIG. 6, a region of a first configuration of the second semiconductor die 700 is illustrated after formation of second metallic bonding pads 798 according to an embodiment of the present disclosure. In this case, the methods illustrated in FIGS. 2A-2E may be employed to form the second metallic bonding pads 798. Each second metallic bonding pad 798 can include a second metallic barrier liner 72, a second pad base portion 74, and a second corrosion barrier layer 76. Each second metallic barrier liner 72 can have the same material composition as, and can have the same thickness range as, any of the first metallic barrier liners 92. Each second pad base portion 74 can have the same material composition as, and can have the same thickness range as, any of the first pad base portions 94. The second corrosion barrier layer 76 can have the same material composition as, and can have the same thickness range as, any of the first corrosion barrier layers 96.

Figure 7:
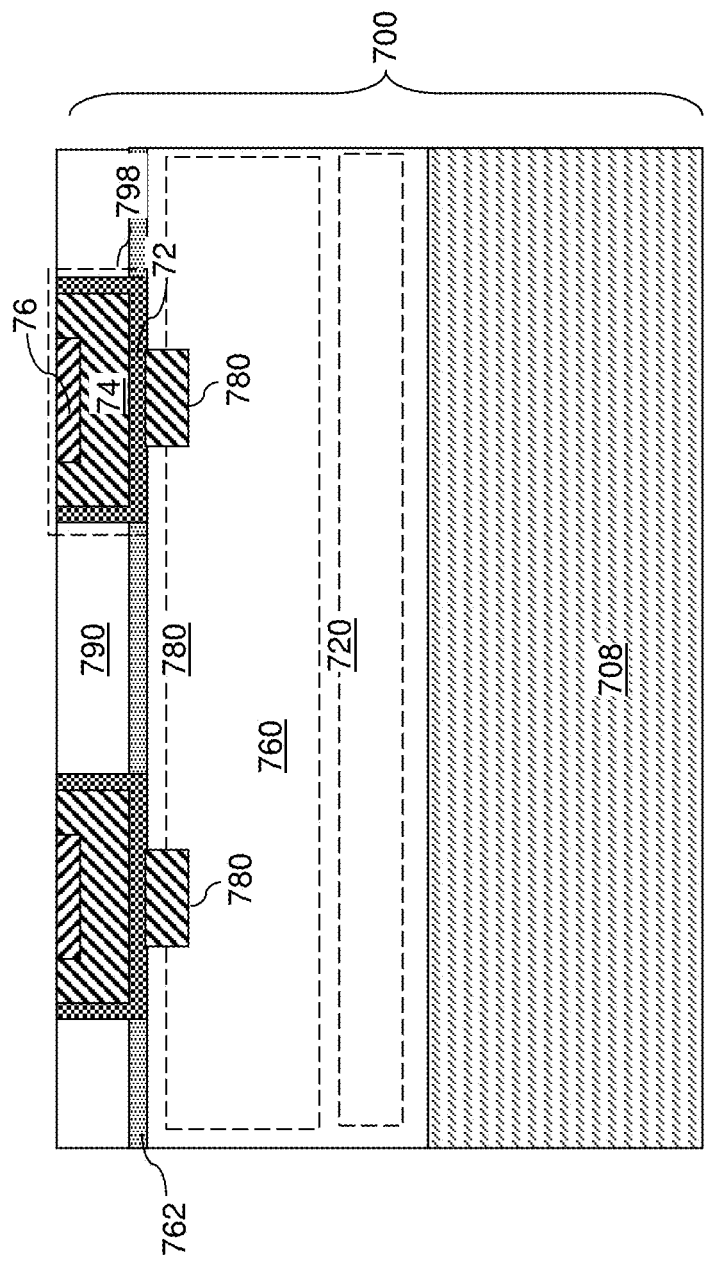
FIG. 7 is a vertical cross-sectional views of a region of a second configuration of the second semiconductor die after formation of second metallic bonding pads according to an embodiment of the present disclosure.

Referring to FIG. 7, a region of a second configuration of the second semiconductor die 700 is illustrated after formation of second metallic bonding pads 798 according to an embodiment of the present disclosure. In this case, the methods illustrated in FIGS. 3A and 3B may be employed to form the second metallic bonding pads 798. Each second metallic bonding pad 798 can include a second metallic barrier liner 72, a second pad base portion 74, and a second corrosion barrier layer 76. Each second metallic barrier liner 72 can have the same material composition as, and can have the same thickness range as, any of the first metallic barrier liners 92. Each second pad base portion 74 can have the same material composition as, and can have the same thickness range as, any of the first pad base portions 94. The second corrosion barrier layer 76 can have the same material composition as, and can have the same thickness range as, any of the first corrosion barrier layers 96.

Figure 8:
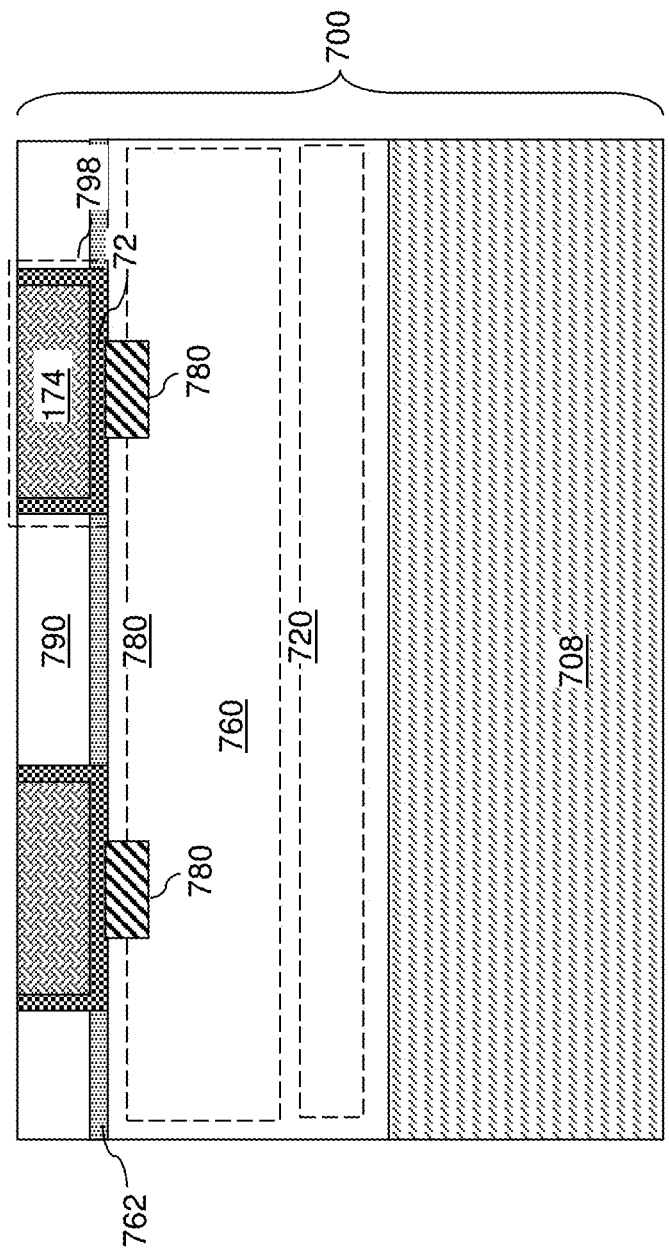
FIG. 8 is a vertical cross-sectional views of a region of a third configuration of the second semiconductor die after formation of second metallic bonding pads according to an embodiment of the present disclosure.

Referring to FIG. 8, a region of a third configuration of the second semiconductor die 700 is illustrated after formation of second metallic bonding pads 798 according to an embodiment of the present disclosure. In this case, the methods illustrated in FIGS. 4A and 4B may be employed to form the second metallic bonding pads 798. Each second metallic bonding pad 798 can include a second metallic barrier liner 72 and a second corrosion barrier layer 76. Each second metallic barrier liner 72 can have the same material composition as, and can have the same thickness range as, any of the first metallic barrier liners 92. Each second corrosion barrier layer 76 can have the same material composition as, and can have the same thickness range as, any of the first corrosion barrier layers 96.

Figure 9:
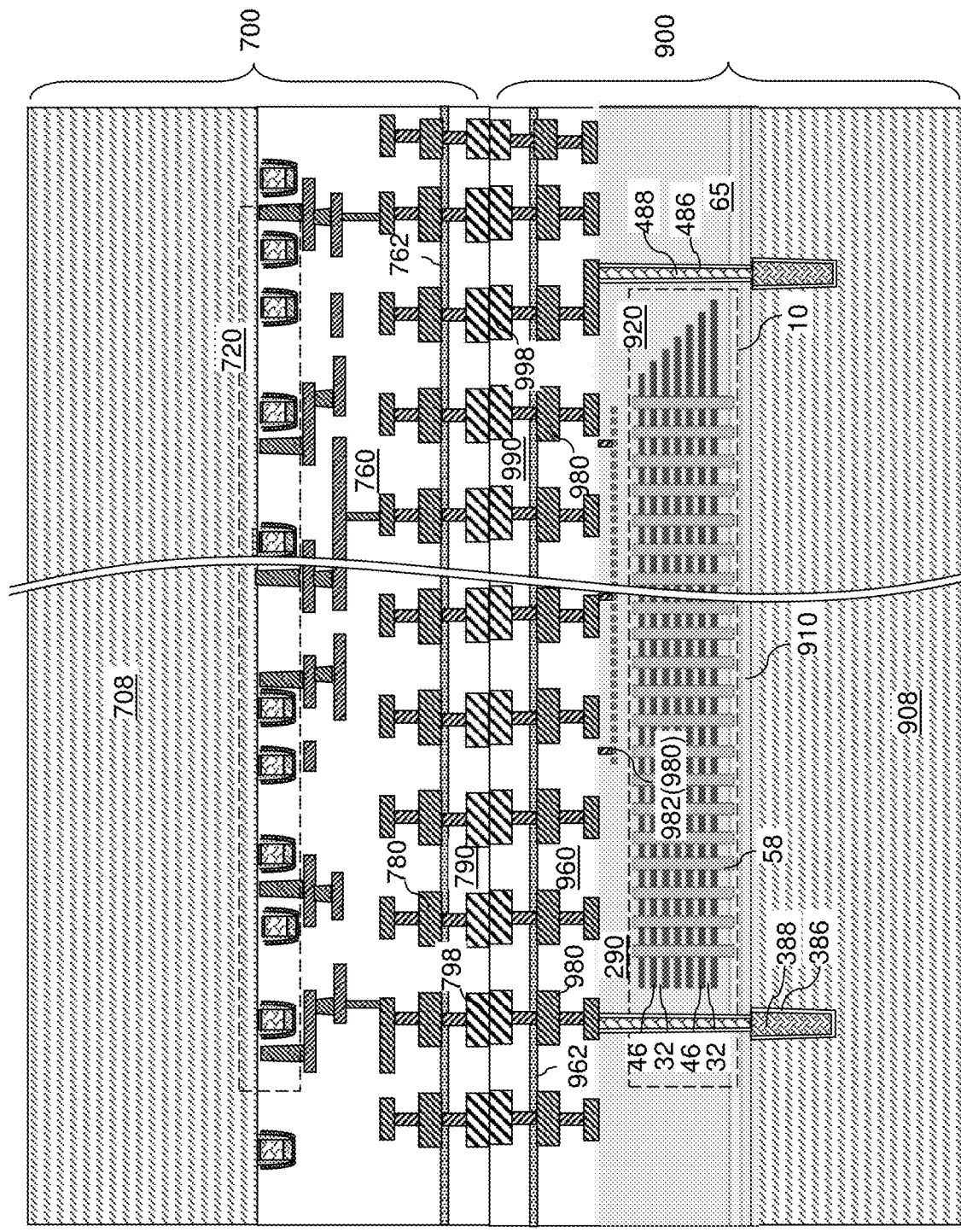
FIG. 9 is a vertical cross-sectional view of an exemplary bonded assembly of a first semiconductor die and a second semiconductor die according to an embodiment of the present disclosure.

Referring to FIG. 9, the first semiconductor die 900 and the second semiconductor die 700 can be bonded to each other by wafer-to-wafer bonding, die-to-wafer bonding, or die-to-die bonding. For example, a first wafer including a plurality of the first semiconductor dies 900 and a second wafer including a plurality of second semiconductor dies 700 can be aligned to each other such that the first metallic bonding pads 998 of each first semiconductor die 900 face the second metallic bonding pads 798 of a corresponding second semiconductor die 700. Generally, the pattern of the first metallic bonding pads 998 in each first semiconductor die 900 can be a mirror image pattern of the second metallic bonding pads 798.

Each facing pair of a first metallic bonding pad 998 and a second metallic bonding pads 798 can be aligned to maximize the areal overlap therebetween. Each facing pair of a first semiconductor die 900 and a second semiconductor die 700 can be brought into contact each other so that each first metallic bonding pad 998 contacts a respective one of the second metallic bonding pads 798 with a respective areal overlap therebetween. The assembly of the first semiconductor die 900 and the second semiconductor die 700 are annealed at an elevated temperature in a range from 250 degrees Celsius to 400 degrees Celsius to induce metal diffusion across each interface between facing pairs of a respective first metallic bonding pad 998 and a respective second metallic bonding pad 798. The duration of the anneal process at the elevated temperature can be in a range from 5 minutes to 2 hours, although shorter or longer anneal duration may also be employed. Each facing pair of a first metallic bonding pad 998 and a second metallic bonding pad 798 is bonded to each other during the anneal process at the elevated temperature. A bonded assembly including the first semiconductor die 900 and the second semiconductor die 700 can be formed.

Figure 10A:
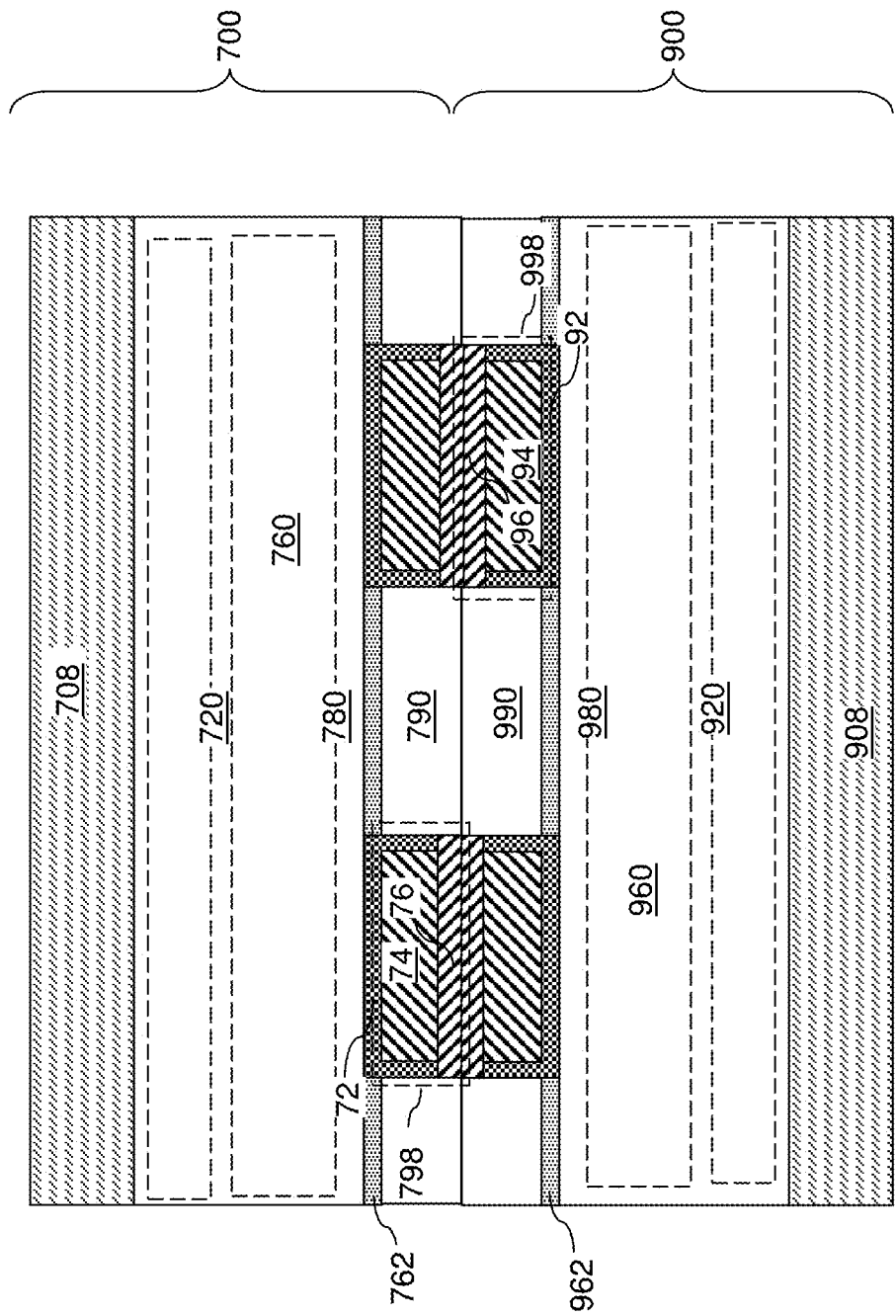
FIGS. 10A and 10B are sequential vertical cross-sectional views of a region of a first configuration of the exemplary bonded assembly according to the first embodiment of the present disclosure.
Figure 10B:
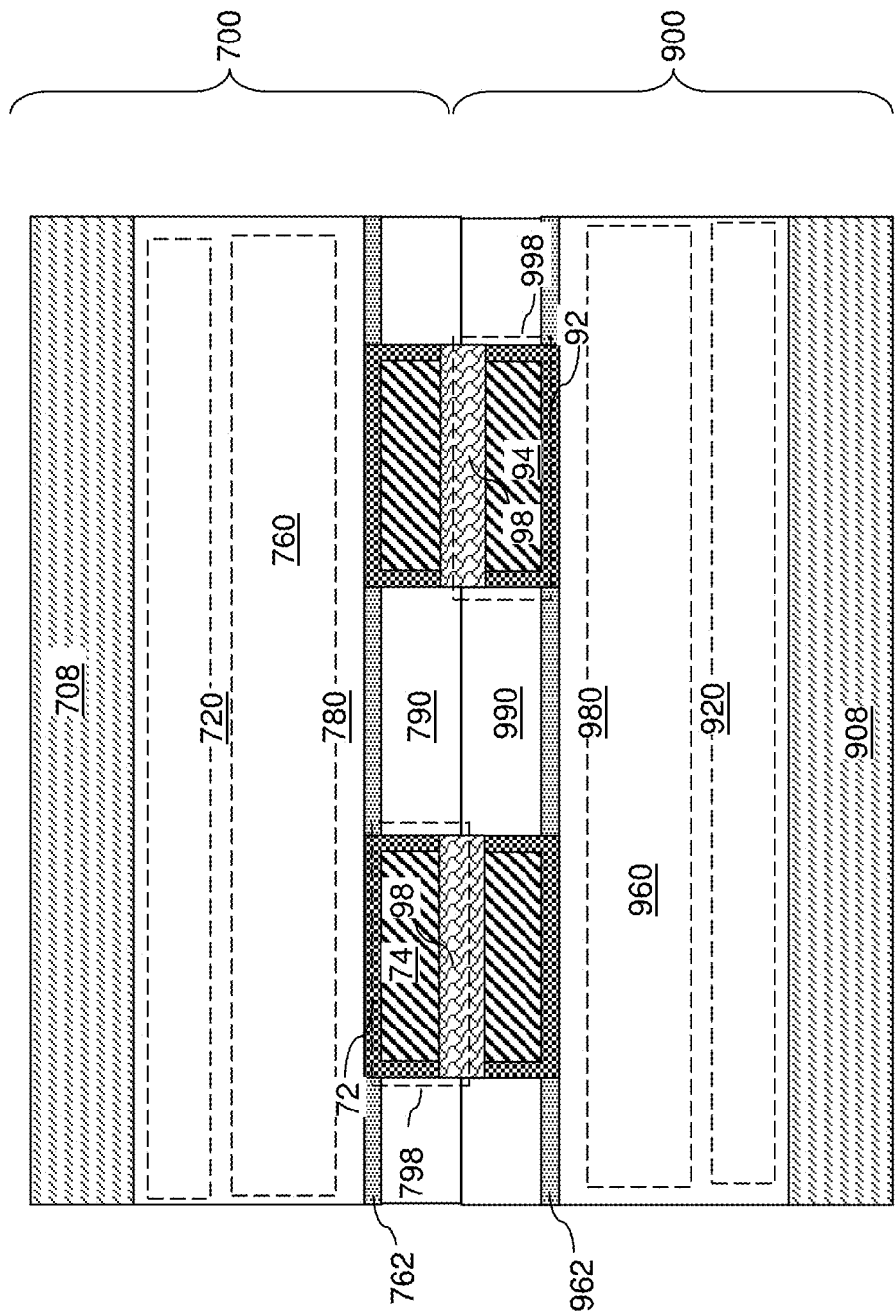

FIGS. 10A and 10B are sequential vertical cross-sectional views of a region of a first configuration of the exemplary bonded assembly according to an embodiment of the present disclosure.

Referring to FIG. 10A, a bonded assembly of a first configuration of the first semiconductor die 900 and a first configuration of the second semiconductor die 700 is illustrated prior to the anneal process. A pair of a first corrosion barrier layer 96 and a second corrosion barrier layer 76 is present at each interface between a first metallic bonding pad 998 and a second metallic bonding pad 798.

Referring to FIG. 10B, the bonded assembly of the first configuration of the first semiconductor die 900 and the first configuration of the second semiconductor die 700 is illustrated after the anneal process. The metallic materials of the pair of a first corrosion barrier layer 96 and a second corrosion barrier layer 76 at each interface between a first metallic bonding pad 998 and a second metallic bonding pad 798 interdiffuse to form a corrosion barrier layer 98. Each first metallic bonding pad 998 can include a first portion of a respective corrosion barrier layer 98, and each second metallic bonding pad 798 can include a second portion of a respective corrosion barrier layer 98.

Figure 11A:
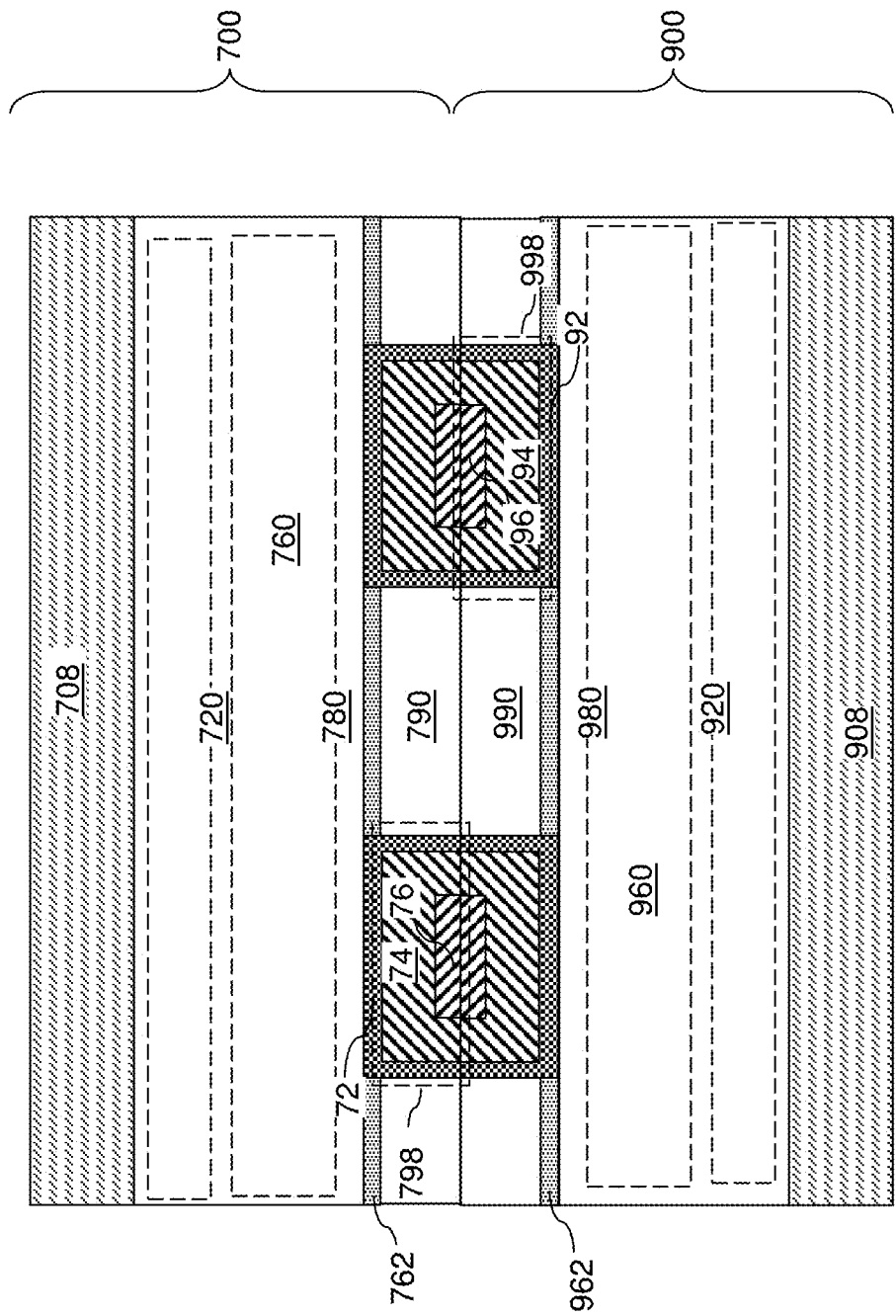
FIGS. 11A and 11B are sequential vertical cross-sectional views of a region of a second configuration of the exemplary bonded assembly according to the second embodiment of the present disclosure.
Figure 11B:
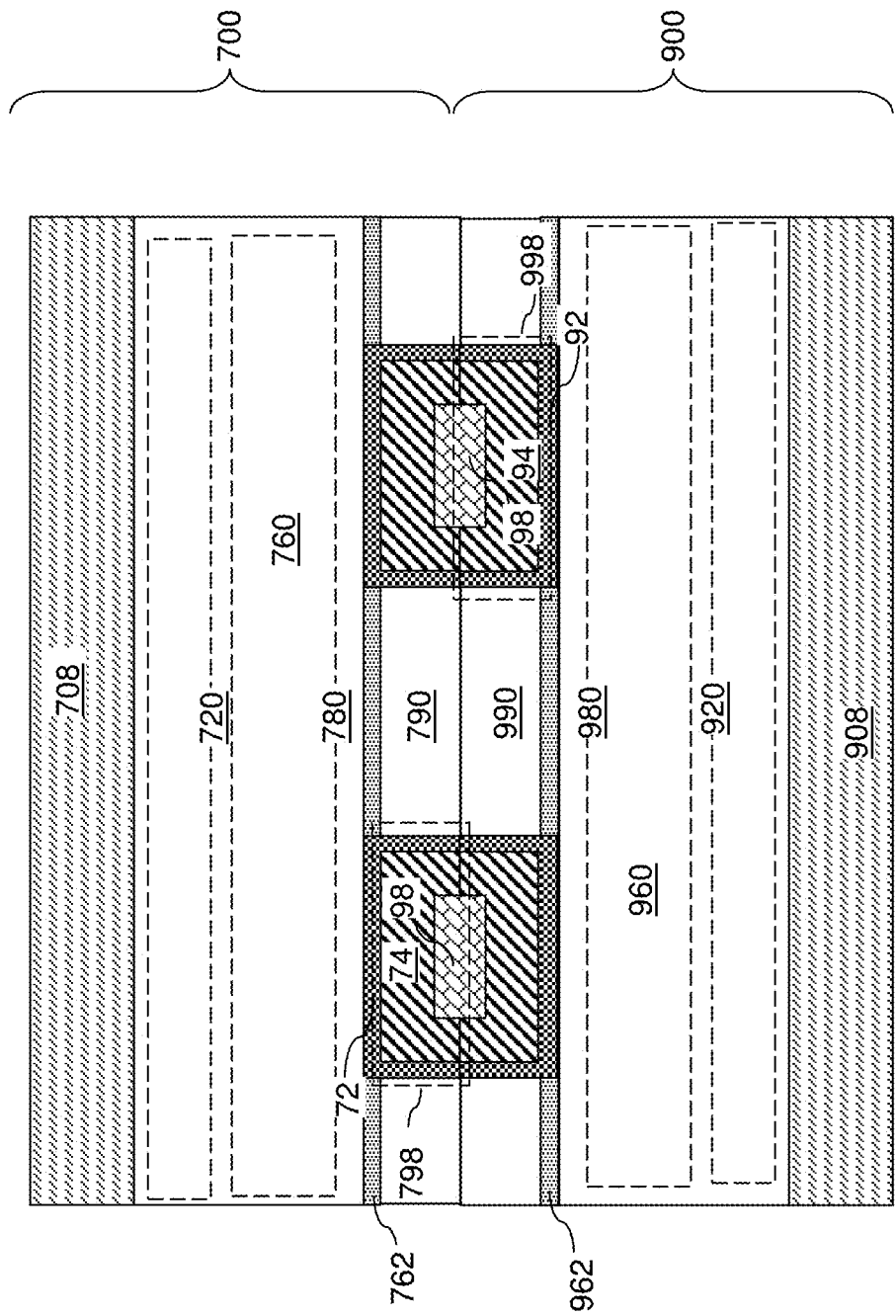

FIGS. 11A and 11B are sequential vertical cross-sectional views of a region of a second configuration of the exemplary bonded assembly according to an embodiment of the present disclosure.

Referring to FIG. 11A, a bonded assembly of a second configuration of the first semiconductor die 900 and a second configuration of the second semiconductor die 700 is illustrated prior to the anneal process. A pair of a first corrosion barrier layer 96 and a second corrosion barrier layer 76 is present at each interface between a first metallic bonding pad 998 and a second metallic bonding pad 798.

Referring to FIG. 11B, the bonded assembly of the second configuration of the first semiconductor die 900 and the second configuration of the second semiconductor die 700 is illustrated after the anneal process. The metallic materials of the pair of a first corrosion barrier layer 96 and a second corrosion barrier layer 76 at each interface between a first metallic bonding pad 998 and a second metallic bonding pad 798 interdiffuse to form a corrosion barrier layer 98. Each first metallic bonding pad 998 can include a first portion of a respective corrosion barrier layer 98, and each second metallic bonding pad 798 can include a second portion of a respective corrosion barrier layer 98.

Referring to FIGS. 10B and 11B, the first pad base portions 94 and/or the second pad base portions 74 can include the primary bonding metal at a first atomic concentration, and the corrosion barrier layer 98 may include the primary bonding metal at a second atomic percentage that is less than the first atomic percentage. Each of the first metallic bonding pads 998 can have a vertical compositional gradient after the thermal anneal process such that an atomic percentage of the primary bonding metal increases within each of the first metallic bonding pads 998 and the second metallic bonding pads 798 with a vertical distance from a horizontal plane including bonding interfaces between the first semiconductor die 900 and the second semiconductor die 700, and an atomic percentage of each of the at least one corrosion-suppressing element decreases within each of the first metallic bonding pads 998 and the second metallic bonding pads 798 with the vertical distance from the horizontal plane.

Figure 12:
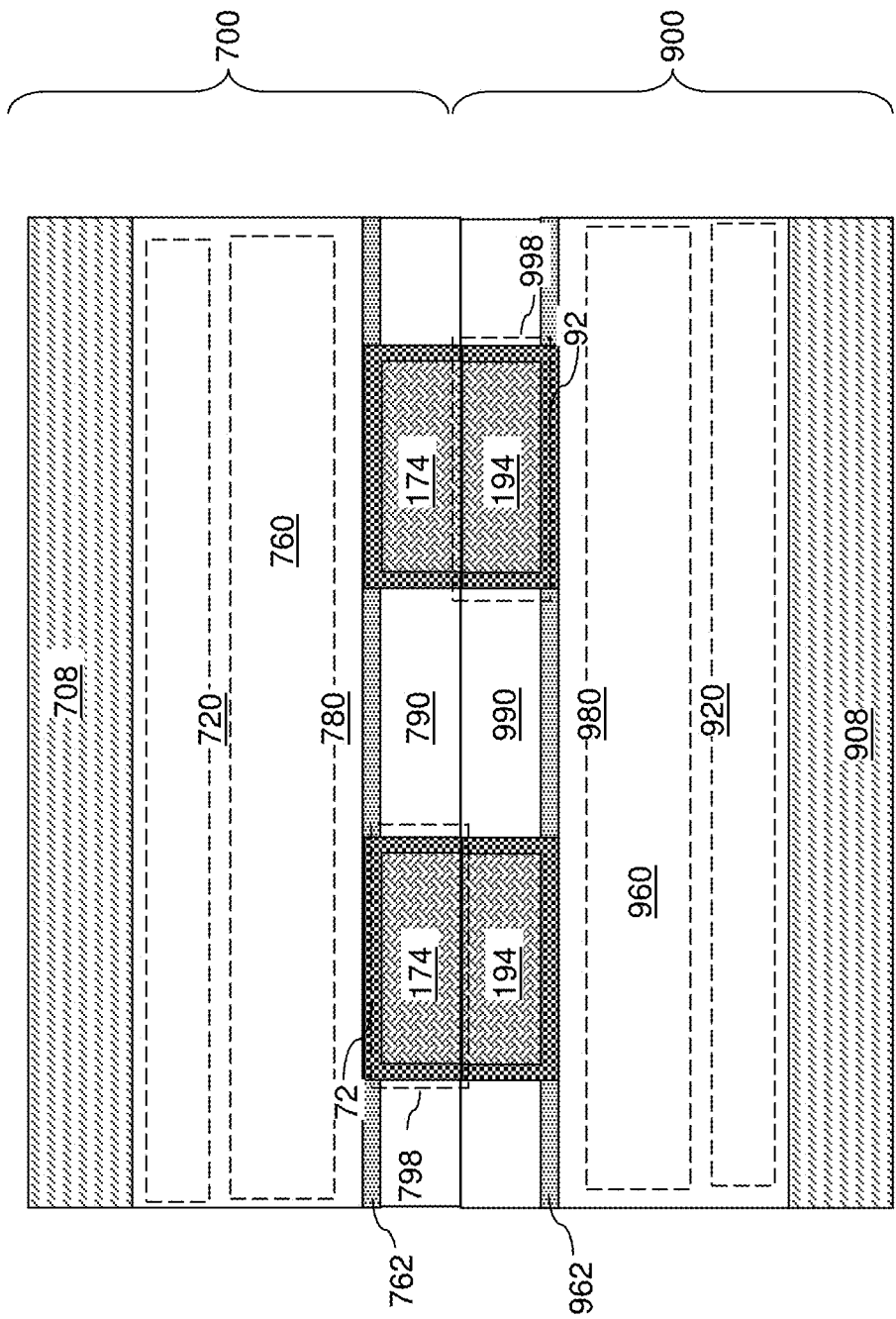
FIG. 12 is a vertical cross-sectional view of a region of a third configuration of the exemplary bonded assembly according to the third embodiment of the present disclosure.

Referring to FIG. 12, a bonded assembly of a third configuration of the first semiconductor die 900 and a third configuration of the second semiconductor die 700 is illustrated after the anneal process. The metallic alloy materials of a pair of first corrosion barrier layer 96 and a second corrosion barrier layer 76 interdiffuse between a first metallic bonding pad 998 and a second metallic bonding pad 798 to provide metal-to-metal bonding.

Figure 13:
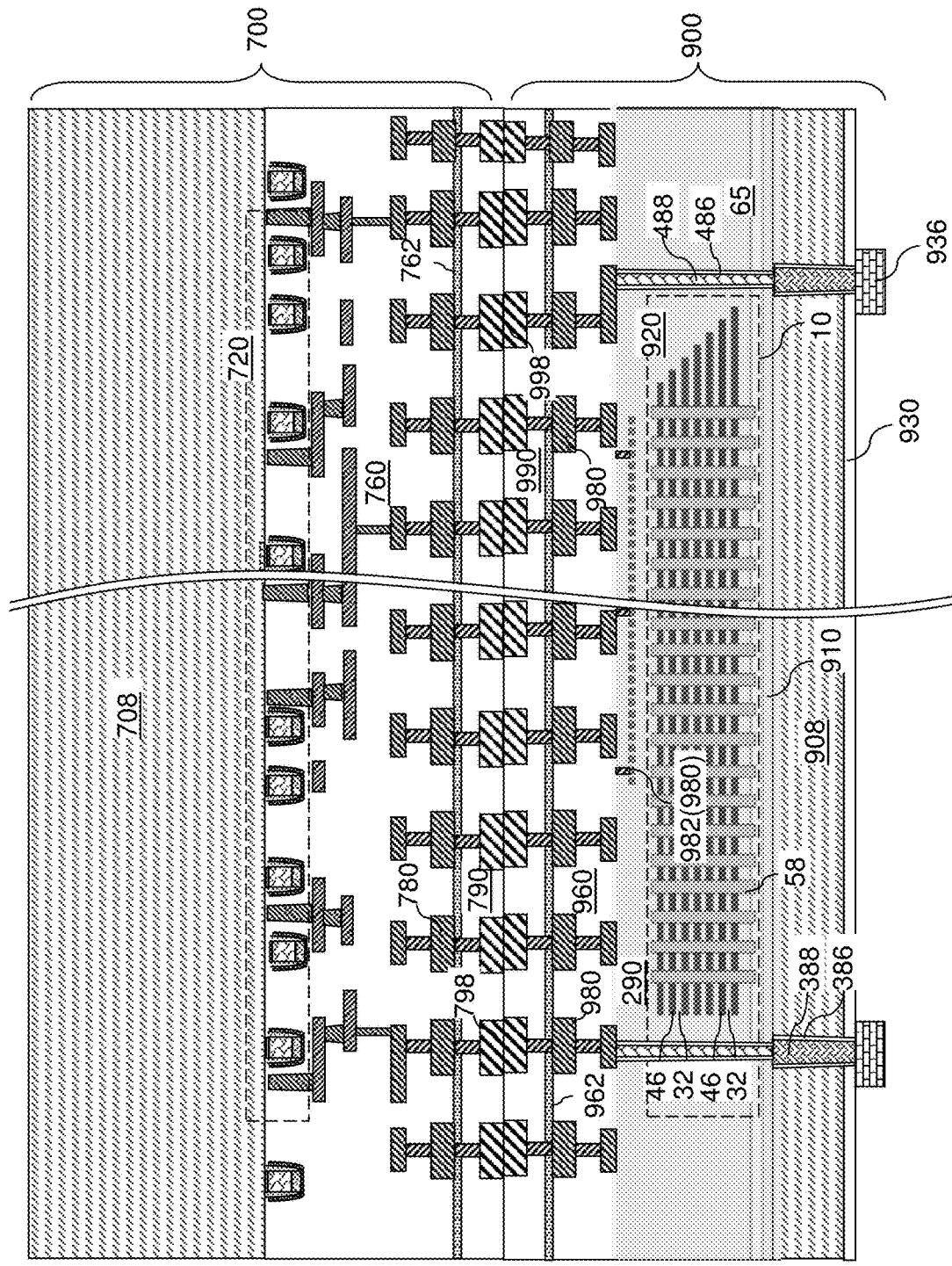
FIG. 13 is a vertical cross-sectional view of the exemplary bonded assembly after formation of backside bonding pads according to an embodiment of the present disclosure.

Referring to FIG. 13, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be employed.

A backside insulating layer 930 may be formed on the backside of the first substrate 908. The backside insulating layer 930 includes an insulating material such as silicon oxide. The thickness of the backside insulating layer 930 can be in a range from 50 nm to 500 nm, although lesser and greater thicknesses can also be employed. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 936 contacting a respective one of the through-substrate via structures 388. The backside bonding pads 936 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Referring to all drawings and according to various embodiments of the present disclosure, a bonded assembly includes a first semiconductor die 900 and a second semiconductor die 700. The first semiconductor die 900 comprises first metallic bonding pads 998 embedded in first dielectric material layers (960, 962, 990). The second semiconductor die 700 comprises second metallic bonding pads 798 embedded in second dielectric material layers (760, 792, 790). The first metallic bonding pads 998 are bonded to a respective one of the second metallic bonding pads 798 within a horizontal plane including a bonding interface between the first semiconductor die 900 and the second semiconductor die 700. Each of the first metallic bonding pads 998 includes a corrosion barrier layer 96 containing an alloy of a primary bonding metal and at least one corrosion-suppressing element that is different from the primary bonding metal.

In one embodiment, the primary bonding metal comprises Cu, and the at least one corrosion-suppressing element comprises Ni, B, or P. In one embodiment, the alloy comprises 50 to 95 atomic percent copper and 10 to 50 atomic percent of the at least one corrosion-suppressing element. In a preferred embodiment, the at least one corrosion-suppressing element comprises Ni.

In one embodiment, each of the first metallic bonding pads 998 further comprises a primary bonding metal layer 94 below the corrosion barrier layer 96. In one embodiment, the primary bonding metal layer comprises pure copper or a copper alloy containing less than 10 atomic percent of the at least one corrosion-suppressing element.

In an alternative embodiment, the primary bonding metal comprises Al, and the at least one corrosion-suppressing element comprises Cu.

In one embodiment, the first semiconductor die 900 further comprises memory devices 920, and the second semiconductor die 700 further comprise peripheral circuitry 720 for operation of the memory devices 920.

The various configurations of the structures of the embodiments of the present disclosure provide enhanced corrosion resistance for metallic bonding pads by employing a Cu—Ni alloy, a Cu—Ni—P alloy, or a Cu—Ni—B alloy in lieu of pure Cu at an interfacial region in copper-to-copper bonding, or by employing an Al—Cu alloy in lieu of pure Al at an interfacial region in aluminum-to-aluminum bonding.

Without wishing to be bound by a particular theory it is believed that pure copper corrosion may be caused by electrochemical potentials during CMP. Due to the electronegativity difference, O or F atoms tend to strip an electron from copper in a cathode half reaction while copper atoms tend to release the electron and form copper ions into the corrosive CMP solution in the anode half reaction. The area ratio of cathode to anode is very high. The long metal lines will act as an antenna to concentrate charge to the small copper islands. In contrast, by adding a corrosion inhibiting alloying element, such as nickel, into copper bonding pads includes incorporating nickel into a passive copper oxide (e.g., $Cu_2O$) film and increases the corrosion resistance in two ways. First, $Ni^{2+}$ ions occupy the vacant positions of $Cu^+$ ions and increase the ionic resistance, which makes two $Cu^+$ ions disappear, and thus increases the ion resistance of the film. Second, $Ni^{2+}$ ions directly replace $Cu^+$ ions, while the ionic resistance does not change and each substitution results in the disappearance of one $Cu^+$ ion and increases the electronic resistance.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a semiconductor structure, comprising:
   providing a first semiconductor die, the first semiconductor die including first semiconductor devices located over a first substrate and including first metal interconnect structures embedded in first dielectric material layers;
   forming pad cavities on a front side of the first semiconductor die, wherein surfaces of a subset of the first metal interconnect structures are physically exposed at bottom surfaces of the pad cavities;

forming first metallic bonding pads in the pad cavities, wherein each of the first metallic bonding pads comprises a corrosion barrier layer comprising an alloy of a primary bonding metal comprising copper or aluminum and at least one corrosion-suppressing element that is different from the primary bonding metal; and bonding the first metallic bonding pads to second metallic bonding pads on a second semiconductor die such that each of the corrosion barrier layers contacts a respective one of the second bonding pads.

2. The method of claim 1, wherein:
the primary bonding metal comprises Cu; and
the at least one corrosion-suppressing element comprises Ni, B, or P.

3. The method of claim 2, wherein the alloy comprises 50 to 95 atomic percent copper and 10 to 50 atomic percent of the at least one corrosion-suppressing element.

4. The method of claim 3, wherein the at least one corrosion-suppressing element comprises Ni.

5. The method of claim 3, further comprising depositing a primary bonding metal layer in the pad cavities followed by depositing the corrosion barrier layer over the primary bonding metal layer.

6. The method of claim 5, wherein the primary bonding metal layer comprises pure copper or a copper alloy containing less than 10 atomic percent of the at least one corrosion-suppressing element.

7. The method of claim 5, further comprising:
removing portions the primary bonding metal layer from above the horizontal plane including the topmost surface of the first dielectric material layers by performing a first chemical mechanical polishing (CMP) process prior to the step of depositing the corrosion barrier layer;
vertically recessing portions of the primary bonding material layer located within the pad cavities below the horizontal plane; and
removing portions of the corrosion barrier layer from above the horizontal plane including the topmost surface of the first dielectric material layers by performing a second chemical mechanical polishing (CMP) process after the step of depositing the corrosion barrier layer.

8. The method of claim 5, further comprising removing portions of the corrosion barrier layer and the primary bonding metal layer from above the horizontal plane including the topmost surface of the first dielectric material layers by performing a chemical mechanical polishing (CMP) process, wherein remaining material portions that fill a respective one of the pad cavities comprise the first metallic bonding pads.

9. The method of claim 1, wherein the corrosion barrier layer has a varying concentration of the at least one corrosion-suppressing element as a function of thickness.

10. The method of claim 1, wherein:
the primary bonding metal comprises Al; and
the at least one corrosion-suppressing element comprises Cu.

11. The method of claim 1, wherein:
the second semiconductor die includes second semiconductor devices located on a second substrate, second metal interconnect structures embedded in second dielectric material layers, and second metallic bonding pads electrically connected to a respective one of the second metal interconnect structures and embedded in a topmost layer among the second dielectric material layers; and
the second metallic bonding pads are bonded with the first metallic bonding pads by performing a thermal anneal process.

12. The method of claim 11, wherein:
the first semiconductor devices comprise memory devices; and
the second semiconductor devices comprise peripheral circuitry for operation of the memory devices.

13. The method of claim 1, wherein each of the first metallic bonding pads comprises a primary pad base portion that underlies a respective one of the corrosion barrier layers and comprising the primary bonding metal.

14. The method claim 13, wherein:
the primary pad base portion comprises the primary bonding metal at a first atomic percentage; and
the corrosion barrier layer comprises the primary bonding metal at a second atomic percentage that is less than the first atomic percentage.

15. The method of claim 14, wherein the first atomic percentage is in a range from 90% to 100%.

16. The method of claim 14, wherein:
the primary bonding metal is copper; and
the primary pad base portion comprises at least one additive element selected from lead, zinc, nickel, iron, sulfur, antimony, arsenic, silver, tin, calcium, or tin at a total atomic percentage less than 1%.

17. The method of claim 14, wherein:
the primary bonding metal is copper; and
the primary pad base portion is free of nickel, boron, and phosphorus.

18. The method of claim 14, wherein:
the primary bonding metal is aluminum; and
the primary pad base portion comprises at least one additive element selected from lead, zinc, nickel, iron, sulfur, antimony, arsenic, silver, tin, calcium, or tin at a total atomic percentage less than 1%.

19. The method of claim 14, wherein:
the primary bonding metal is aluminum; and
the primary pad base portion is free of copper.

20. The bonded assembly of claim 13, wherein each of the primary pad base portions is formed by:
depositing a primary bonding metal layer in the pad cavities, and
recessing the primary bonding metal layer such that remaining portions of the primary bonding metal layer have recessed top surfaces below a horizontal plane including top peripheries of the pad cavities, wherein remaining portions of the primary bonding metal layer comprise the primary pad base portions.

* * * * *